United States Patent
Day

(10) Patent No.: US 11,812,557 B2
(45) Date of Patent: Nov. 7, 2023

(54) ELECTRICAL DEVICE, INTERLAYER PLY INCLUDING AN ELECTRICAL DEVICE AND METHODS FOR MAKING SAID ELECTRICAL DEVICE AND INTERLAYER PLY

(71) Applicant: Pilkington Group Limited, Nr. Ormskirk (GB)

(72) Inventor: Stephen Roland Day, Wigan (GB)

(73) Assignee: PILKINGTON GROUP LIMITED, Lancashire (GB)

( * ) Notice: Subject to any disclaimer, the term of this patent is extended or adjusted under 35 U.S.C. 154(b) by 186 days.

(21) Appl. No.: 17/273,249

(22) PCT Filed: Sep. 4, 2019

(86) PCT No.: PCT/GB2019/052455
§ 371 (c)(1),
(2) Date: Mar. 3, 2021

(87) PCT Pub. No.: WO2020/049292
PCT Pub. Date: Mar. 12, 2020

(65) Prior Publication Data
US 2021/0329787 A1    Oct. 21, 2021

(30) Foreign Application Priority Data
Sep. 4, 2018    (GB) ...................................... 1814347

(51) Int. Cl.
*H05K 1/18*    (2006.01)
*H05K 1/14*    (2006.01)
(Continued)

(52) U.S. Cl.
CPC ............. *H05K 1/187* (2013.01); *H05K 1/147* (2013.01); *H05K 3/0097* (2013.01); *H05K 3/284* (2013.01);
(Continued)

(58) Field of Classification Search
CPC ...... H05K 1/187; H05K 1/147; H05K 3/0097; H05K 3/284; H05K 2201/09754; H05K 2201/10106; H05K 2201/10151
(Continued)

(56) References Cited

U.S. PATENT DOCUMENTS 5,426,568 A    6/1995 Lamers et al.
9,398,714 B1 *   7/2016 Liu ....................... H05K 1/0393
(Continued)

FOREIGN PATENT DOCUMENTS

EP    0603739 A1    6/1994
EP    1534513 B1    4/2011
(Continued)

OTHER PUBLICATIONS

GB Search Report issued in corresponding Patent Application No. GB1814347.9 dated Feb. 28, 2019, 4 pages.
(Continued)

*Primary Examiner* — Binh B Tran
(74) *Attorney, Agent, or Firm* — BUCHANAN INGERSOLL & ROONEY PC

(57) ABSTRACT

A method of making an electrical device is described. The method comprises the steps: (i) providing a layer of interlayer material having a first major surface and a second opposing major surface; (ii) positioning at least a first electrically operable component on the first major surface of the first layer of interlayer material, the first electrically operable component being mounted on a first circuit board; and (iii) providing a layer of adhesive material, preferably as a liquid, to cover at least a portion of the first major surface of the layer of interlayer material and at least a portion of the first electrically operable component and/or at least a portion of the first circuit board such that following step (iii) the first electrically operable component is fixed on the layer of (Continued)

interlayer material by at least a portion of the layer of adhesive material.

20 Claims, 10 Drawing Sheets

(51) Int. Cl.
*H05K 3/00* (2006.01)
*H05K 3/28* (2006.01)

(52) U.S. Cl.
CPC .............. *H05K 2201/09754* (2013.01); *H05K 2201/10106* (2013.01); *H05K 2201/10151* (2013.01)

(58) Field of Classification Search
USPC ........................................................ 361/748
See application file for complete search history.

(56) References Cited

U.S. PATENT DOCUMENTS

| | | |
|---|---|---|
| 2005/0238857 A1 | 10/2005 | Day |
| 2016/0313587 A1 | 10/2016 | Linthout et al. |
| 2017/0294776 A1* | 10/2017 | Maier .................. H05K 9/0079 |
| 2018/0182683 A1* | 6/2018 | Val ........................ H01L 23/552 |
| 2020/0045840 A1* | 2/2020 | Kraus .................... H05K 3/361 |

FOREIGN PATENT DOCUMENTS

| | | |
|---|---|---|
| JP | H09293804 A | 11/1997 |
| JP | H10284630 A | 10/1998 |
| WO | 2017203132 A1 | 11/2017 |
| WO | 2018025051 A1 | 2/2018 |

OTHER PUBLICATIONS

International Search Report (PCT/ISA/210) dated Jan. 7, 2020, by the British Patent Office as the International Searching Authority for International Application No. PCT/GB2019/052455, 4 pages.

Written Opinion (PCT/ISA/237) dated Jan. 7, 2020, by the British Patent Office as the International Searching Authority for International Application No. PCT/GB2019/052455, 8 pages.

* cited by examiner

ELECTRICAL DEVICE, INTERLAYER PLY INCLUDING AN ELECTRICAL DEVICE AND METHODS FOR MAKING SAID ELECTRICAL DEVICE AND INTERLAYER PLY

The present invention relates to an electrical device, an interlayer ply incorporating an electrical device that is useful in making a laminated glazing and to a method for making such an electrical device and interlayer ply.

It is known to incorporate electronic components in between two panes of glass in a laminated glazing.

US2016/0313587A1 describes a laminated motor vehicle glazing into which electrically supplied function assemblies are inserted. WO2018/025051A1 describes a laminated glazing comprising first and second sheets of glazing material having therebetween at least one sheet of adhesive interlayer material, a first electrically actuated device and a first receiver coil in electrical communication with the first electrically actuated device. Methods for making such laminated glazings are also described in WO2018/025051A1.

In EP1534513B1 a laminated glazing panel comprising two glass plies, a plastic ply and one or more light emitting diodes mounted on a circuit board which are laminated between the glass plies is described. Such a laminated glazing may be produced using a process including, before the lamination process, the step of preparing a cut-out area in the plastic ply to receive the circuit board. The circuit board and or more light emitting diodes may be at least partially coated with a material compatible with the material of the plastic ply. The circuit board is positioned in the cut-out area in the plastic ply.

Another process for the production of a laminated glazing is also described in EP1534513B1, said process comprising pairing two plastic plies, preparing a cut-out area in the upper plastic ply to receive a circuit board on which one or more light emitting diodes are mounted, positioning said circuit board in the cut-out area, joining a further plastic ply to the paired plastic plies, thereby creating a composite ply, interleaving the composite ply between two glass plies and laminating the plies. The circuit board and one or more light emitting diodes together may be at least partially coated with a material compatible with the material of the plastic ply and the overall thickness of the coated circuit board on which the one or more light emitting diodes are mounted is preferably comparable with the thickness of the plastic ply in which it is positioned.

The problem with such manufacturing processes is that when placing the plastic ply with a cut-out area therein onto a first glass sheet, it can be difficult to insert the circuit board into the aperture without risk of stretching the cut-out area and/or stretching the plastic ply. This problem may be more prominent when the first glass sheet is curved, as is often the case in the field of automotive glazings.

Accordingly, the present invention provides from a first aspect a method of making an electrical device comprising the steps:

(i) providing a layer of interlayer material having a first major surface and a second opposing major surface;

(ii) positioning at least a first electrically operable component on the first major surface of the first layer of interlayer material, the first electrically operable component being mounted on a first circuit board; and (iii) providing a layer of adhesive material to cover at least a portion of the first major surface of the first layer of interlayer material and at least a portion of the first electrically operable component and/or at least a portion of the first circuit board.

For the avoidance of doubt, during step (iii) the provision of the layer of adhesive material may (a) cover at least a portion of the first major surface of the layer of interlayer material and at least a portion of the first electrically operable component, or (b) cover at least a portion of the first major surface of the first layer of interlayer material and at least a portion of the first electrically operable component and at least a portion of the first circuit board, or (c) cover at least a portion of the first major surface of the first layer of interlayer material and at least a portion of the first circuit board.

The layer of adhesive material provided in step (iii) is used to fix the first electrically operable component on the layer of interlayer material following step (iii). That is, following step (iii), the first electrically operable component is fixed to the first layer of interlayer material by at least a portion of the layer of adhesive material.

The first electrically operable component has first and second electrical input terminals for connection to a suitable power supply having first and second output terminals, such that upon bringing the first input terminal of the at least one electrically operable component into electrical communication with the first output terminal of the suitable power supply and bringing the second input terminal of the first electrically operable component into electrical communication with the second output terminal of the suitable power supply, electrical power is provided to the at least one electrically operable component.

The electrical device produced using the method according to the first aspect of the present invention may be used in the form so produced or may be used as a parent electrical device for producing a child electrical device therefrom, the parent device and the child device each have a respective first major surface and an opposing second major surface, wherein at least one of the first and second major surfaces of the child electrical device has a smaller area than the first or second major surface of the parent electrical device.

Preferably the layer of interlayer material is provided as a sheet.

Preferably the layer of interlayer material comprises a monolithic sheet or a multi-layered sheet.

Preferably the interlayer material comprises polyvinyl butyral (PVB), a copolymer of ethylene, such as ethylene vinyl acetate (EVA) or polyurethane, in particular a thermoplastic polyurethane (TPU).

Preferably the layer of interlayer material comprises a sheet of polyvinyl butyral (PVB), a sheet of a copolymer of ethylene, such as ethylene vinyl acetate (EVA) or a sheet of polyurethane, in particular a thermoplastic polyurethane (TPU).

Preferably the first circuit board comprises a substrate having a first major surface and a second opposing major surface, wherein during step (ii) the second major surface of the substrate faces the layer of interlayer material and wherein preferably the electrically operable component is mounted on the first major surface of the substrate.

Preferably in step (ii), the first circuit board is positioned on the first major surface of the layer of interlayer material such that the first circuit board is between the layer of interlayer material and the first electrically operable component.

Preferably following step (iii) the layer of adhesive material directly contacts the first major surface of the layer of interlayer material and the first electrically operable component and/or the first circuit board.

Preferably the adhesive material is a plastic material.

Preferably the adhesive material comprises polyvinyl butyral (PVB), a copolymer of ethylene, such as ethylene vinyl acetate (EVA) or polyurethane, in particular a thermoplastic polyurethane (TPU).

Preferably in step (iii) the layer of adhesive material is provided as a liquid (i.e. in liquid form). By providing the layer of adhesive material in liquid form, the adhesive material may be poured or sprayed to cover at least a portion of the first major surface of the layer of interlayer material and at least a portion of the first electrically operable component and/or at least a portion of the first circuit board.

When the layer of adhesive material is initially provided in liquid form (i.e. as a liquid), the liquid covers at least a portion of the first major surface of the layer of interlayer material and at least a portion of the first electrically operable component and/or at least a portion of the first circuit board, following which the liquid preferably undergoes a solidification step. Preferably the solidification step of the liquid includes a setting step and/or a curing step. Preferably the solidification step of the liquid includes a thermal heating step and/or an irradiation step, preferably an ultra violet irradiation step.

When the layer of adhesive material is initially provided as a liquid and then undergoes a solidification step, the surface of the solidified layer of adhesive material not facing the layer of interlayer material is preferably textured and/or preferably provided with a coating.

When the layer of adhesive material is initially provided as a liquid, preferably the liquid comprises a two-component system comprising at least a first component and a second component, preferably wherein the first component is mixed with the second component prior to, or after having been provided during step (iii).

When the layer of adhesive material is initially provided as a liquid, preferably the liquid is levelled to achieve a uniform thickness relative to the first layer of interlayer material, more preferably a uniform thickness relative to the first major surface and/or second major surface of the first layer of interlayer material.

In some embodiments the layer of adhesive material has a thickness between 0.3 mm and 3.0 mm, preferably between 0.3 mm and 2.0 mm, more preferably between 0.3 mm and 1.6 mm. Preferably the layer of plastic material has thickness of 0.38 mm, or 0.76 mm, or 1.14 mm or 1.52 mm.

Preferably the layer of adhesive material has a uniform thickness.

Preferably the layer of adhesive material is optically clear or tinted.

Preferably the layer of adhesive material covers the entire electrically operable component and/or the entire first circuit board.

In some embodiments after step (i) a first barrier is provided on the first major surface of the layer of interlayer material or around the periphery of the layer of interlayer material and following step (ii) at least a portion of the first circuit board is inboard of the first barrier.

Preferably the first barrier surrounds the first circuit board such that the entire first circuit board is inboard of the first barrier.

Preferably a second barrier is also provided on the first major surface of the layer of interlayer material, the second barrier communicating with the first barrier to define a space in which at least a portion of the first circuit board is positioned following step (ii).

In some embodiments following step (ii) at least a second electrically operable component is positioned on the layer of interlayer material, the second electrically operable component being mounted on the first circuit board and being spaced apart from the first electrically operable device.

In some embodiments following step (ii) at least a second electrically operable component is positioned on the layer of interlayer material, the second electrically operable component being mounted on a second circuit board, the second electrically operable component being spaced apart from the first electrically operable device and/or the first circuit board being spaced apart from the second circuit board.

Preferably the first electrically operable component is mounted on a first circuit board and the second electrically operable component is mounted on a second circuit board, and when the first and second electrically operable components are positioned on the first layer of interlayer material, the first circuit board is spaced apart from the second circuit board.

In embodiments where the first electrically operable component is mounted on a first circuit board and there is a second electrically operable component mounted on a second circuit board, preferably a first barrier and a second barrier are provided on the first major surface of the layer of interlayer material and following step (iii) the first circuit board is inboard of the first barrier and the second circuit board is inboard of the second barrier. It is preferred that the second barrier is not within the perimeter defined by the first barrier.

In embodiments where the first electrically operable component is mounted on a first circuit board and the second electrically operable component is mounted on a second circuit board, preferably a first barrier is provided on the first major surface of the layer of interlayer material or around the periphery of the layer of interlayer material and following step (iii) the first and second circuit boards are inboard of the first barrier.

In embodiments where the first electrically operable component is mounted on a first circuit board and the second electrically operable component is mounted on a second circuit board, preferably during step (iii), the layer of adhesive material also covers at least a portion of the second electrically operable component and/or at least a portion of the second circuit board, more preferably wherein the layer of adhesive material also covers the entire second electrically operable component and/or the entire second circuit board.

In embodiments where the first electrically operable component is mounted on a first circuit board and the second electrically operable component is mounted on a second circuit board, preferably following step (iii) a second layer of adhesive material is provided to cover at least a portion of the second electrically actuated device and/or at least a portion of the second circuit board. Preferably the second layer of adhesive material is provided as a liquid, preferably by pouring or spraying. When the second layer is initially provided as a liquid, the liquid of the second layer of adhesive material preferably undergoes a subsequent solidification step. Preferably the subsequent solidification step of the liquid of the second layer of adhesive material includes a setting step and/or a curing step. Preferably the subsequent solidification step of the liquid of the second layer of adhesive material includes a thermal heating step and/or an irradiation step, preferably an ultra violet irradiation step.

Preferably the liquid of the second layer of adhesive material is levelled to achieve a uniform thickness relative to the first layer of interlayer material, more preferably a uniform thickness relative to the first major surface and/or second major surface of the first layer of interlayer material.

In embodiments where the second layer of adhesive material is initially provided as a liquid and has then undergone a subsequent solidification step, the surface of the second layer of adhesive material not facing the first layer of interlayer material is textured and/or provided with a coating.

In some embodiments, following step (iii) the first circuit board having the first electrically operable component mounted thereon is removed from the layer of interlayer material, preferably by a cutting step or a punching step, thereby producing a child electrical device.

In some embodiments, when the first circuit board having the first electrically operable component mounted thereon is removed from the layer of interlayer material, at least a portion of the first circuit board is between a portion of the layer of adhesive material and a portion of the layer of interlayer material and at least a portion of the layer of interlayer material is joined to at least a portion of the layer of adhesive material.

In some embodiments having a first electrically operable component mounted on a first circuit board and a second electrically operable component mounted on a second circuit board, and when following step (iii) the first circuit board is covered on one side by the first layer of interlayer material and covered on the opposite side by at least a portion of the layer of adhesive material, and the second circuit board is covered on one side by the first layer of interlayer material and covered on the opposite side by at least a portion of the layer of adhesive material, and wherein at least a portion of the layer of adhesive material is in contact with the first major surface of the layer of interlayer material fixing the first and second circuit boards to the layer of interlayer material, and wherein the first circuit board is spaced apart from the second circuit board, preferably the method includes a separation step, after step (iii) to separate the first electrically operable component and/or the second electrically operable component from the layer of interlayer material, thereby producing at least one child electrical device.

During the separation step it is preferred that the entire first and/or second circuit board having the respective first and second electrically operable component mounted thereon is separated from the layer of interlayer material.

Preferably during the separation step the first electrically operable component mounted on the first circuit board and/or the second electrically operable component mounted on the second circuit board is separated from the layer of interlayer material thereby producing a first child electrical device and/or a second daughter electrical device.

Preferably the separation step comprises a cutting step or a punching step.

When the separation step comprises a cutting step, preferably the cutting step comprises at least one of a laser cutting step, a thermal cutting step and a mechanical cutting step.

In other embodiments the first layer of adhesive material is provided as a sheet of adhesive material and following step (iii) the sheet of adhesive material is heated to fuse the sheet of adhesive material to the portion of the first major surface of the layer of interlayer material and the portion of the first electrically operable device and/or the portion of the first circuit board.

In some embodiments after step (iii), the method includes incorporating the electrical device, in an aperture in a sheet of interlayer material, wherein incorporating the electrical device in the aperture in the sheet of interlayer material comprises the steps of providing a sheet of interlayer material having a first major surface and a second opposing major surface; removing at least a first portion of the sheet of interlayer material to make an aperture in the sheet of interlayer material, the aperture in the sheet of interlayer material having at least a first wall between the first and second major surfaces of the sheet of interlayer material; positioning at least a portion of the electrical device in the aperture; using bonding means to fix the electrical device to at least a portion of the first and/or second major surface of the sheet of interlayer material and/or at least a portion of the first wall of the aperture in the sheet of interlayer material. For the avoidance of doubt, in such embodiments wherein the layer of interlayer material in step (i) is provided as a sheet of interlayer material, this sheet may be referred to as a first sheet of interlayer material and the sheet of interlayer material in which an aperture is formed to incorporate the electrical device may be referred to as a second sheet of interlayer material.

In these embodiments an interlayer ply comprising a sheet of interlayer material and an electrical device according to an aspect of the present invention is produced that may be used in the subsequent production of a laminated glazing, the laminated glazing comprising at least one sheet of glazing material, preferably glass, in particular soda-lime-silica glass, with the interlayer ply joined thereto.

The electrical device may be a parent electrical device, or a child electrical device produced from a parent electrical device i.e. by removal from the parent electrical device by cutting.

By bonding the electrical device to the first wall of the aperture in the ply of interlayer material and/or the first and/or second major surface of the sheet of interlayer material simplifies the subsequent lamination process with a sheet of glazing material.

Preferably the first electrically operable component is positioned at least partially in the aperture in the ply of interlayer material.

Preferably the bonding means comprises an adhesive for attaching the first circuit board of the electrical device to the first major surface of the ply of interlayer material and/or the first wall of the aperture in the ply of interlayer material.

Preferably the bonding means comprises an adhesive for attaching the electrical device to the first major surface of the ply of interlayer material and/or the first wall of the aperture in the ply of interlayer material.

Preferably the adhesive bonding means is initially provided as a liquid that subsequently set or cures.

Preferably the adhesive bonding means comprises polyvinyl butyral (PVB), a copolymer of ethylene, such as ethylene vinyl acetate (EVA) or polyurethane, in particular a thermoplastic polyurethane (TPU).

The first circuit board of the electrical device has a first major surface and an opposing second major surface and preferably the entire first and/or second major surface of the first circuit board is covered with a layer of adhesive bonding means.

In other embodiments the bonding means comprises a fusing step to fuse at least a portion of the layer of interlayer material of the electrical device to the wall of the aperture in the ply of interlayer material and/or the first and/or second major surface of the ply of interlayer material. Preferably the fusing step comprises a thermal fusing step. Preferably the thermal fusing step comprises a laser heating step.

In some embodiments before step (iii) a flex circuit is positioned on the layer of interlayer material or the first circuit board, the flex circuit comprising a substrate having a first major surface and an opposing second major surface, the first or second major surface of the substrate of the flex circuit comprising a first electrical connector region thereon in electrical communication with a second electrical connector region on the first or second major surface of the substrate of the flex circuit by means of an electrically conductive track; wherein the flex circuit is positioned such that the second electrical connector region on the substrate of the flex circuit is in electrical communication with a first electrical connector region on the first circuit board.

Preferably the flex circuit is positioned such that the second electrical connector region on the substrate of the flex circuit is in mechanical communication with the first electrical connector region on the first circuit board.

Preferably the substrate of the flex circuit comprises on the first or second major surface thereof a third electrical connector region in electrical communication with a fourth electrical connector region on the first or second major surface of the substrate of the flex circuit by means of an electrically conductive track; wherein the flex circuit is positioned such that the fourth electrical connector region on the substrate of the flex circuit is in electrical communication with a second electrical connector region on the first circuit board.

Preferably the flex circuit is positioned such that the fourth electrical connector region on the substrate of the flex circuit is in mechanical communication with the second electrical connector region on the first circuit board.

The first electrically operable component has first and second electrical input terminals for connection to a suitable power supply having first and second output terminals, such that upon bringing the first input terminal of the at least one electrically operable component into electrical communication with the first output terminal of the suitable power supply and bringing the second input terminal of the first electrically operable component into electrical communication with the second output terminal of the suitable power supply, electrical power is provided to the at least one electrically operable component.

The first electrical connector region on first circuit board is in electrical communication with the first input terminal of the first electrically operable device and when present, the second electrical connector region on first circuit board is in electrical communication with the second input terminal of the first electrically operable device. Upon bringing the first electrical connector region on the first circuit board into electrical communication with the first output terminal of the suitable power supply and bringing the second input terminal of the first electrically operable component into electrical communication with the second output terminal of the suitable power supply, which may be via the second electrical connector region when present, electrical power is provided to the at least one electrically operable component.

The present invention also provides from a second aspect an electrical device comprising: at least one electrically operable component mounted on a first circuit board, the first circuit board having a first major surface and a second opposing major surface; at least one layer of interlayer material having an outer major surface; and at least one layer of adhesive material having an outer major surface; wherein the first circuit board with the at least one electrically operable component mounted thereon is between the outer major surface of the at least one layer of interlayer material and the outer major surface of the at least one layer of adhesive material; further wherein the first circuit board is fixed to the layer of interlayer material by means of at least the layer of adhesive material; characterised in that the electrical device has a first outer surface and a second opposing outer surface, wherein (a) the first outer surface of the electrical device comprises the outer major surface of the at least one layer of interlayer material and the second outer surface of the electrical device comprises the outer major surface of the at least one layer of adhesive material, or (b) the first outer surface of the electrical device comprises the outer major surface of the at least one layer of adhesive material and the second outer surface of the electrical device comprises the outer major surface of the at least one layer of interlayer material.

Preferably the at least one electrically operably component is between the first circuit board and the at least one layer of adhesive material.

The first circuit board has a periphery and preferably the at least one layer of adhesive material covers the first circuit board and extends beyond the periphery thereof to contact the at least one layer of interlayer material for fixing the first circuit board to the at least one layer of interlayer material, more preferably wherein the at least one layer of adhesive material covers the entire first circuit board and extends beyond the periphery thereof to contact the at least one layer of interlayer material for fixing the first circuit board to the at least one layer of interlayer material.

The at least one electrically operable component has first and second electrical input terminals for connection to a suitable power supply having first and second output terminals, such that upon bringing the first input terminal of the at least one electrically operable component into electrical communication with the first output terminal of the suitable power supply and bringing the second input terminal of the at least one electrically operable component into electrical communication with the second output terminal of the suitable power supply, electrical power is provided to the at least one electrically operable component.

Preferably the first circuit board comprises a first electrical connector region in electrical communication with the first input terminal of the at least one electrically operable component, preferably by means of a first conductive track on the first circuit board.

Preferably the first circuit board comprises a second electrical connector region in electrical communication with the second input terminal of the at least one electrically operable component, preferably by means of a second conductive track on the first circuit board.

Preferably the first circuit board comprises a substrate, in particular a substrate comprising polyethylene terephthalate, the substrate having a first major surface and a second opposing major surface, and wherein preferably the first circuit board comprises first and second electrical connector regions on the first major surface of the substrate, the first electrical connector region on the substrate being in electrical communication with the first input terminal of the at least one electrically operable component by means of a first electrically conductive track or a first electrically conductive coating on at least a portion of the first or second major surface of the substrate and the second electrical connector region on the substrate being in electrical communication with the second input terminal of the at least one electrically operable component by means of a second electrically conductive track or second electrically conductive coating on at least a portion of the first or second major surface of the substrate.

In some embodiments having a first electrical connector region on the first circuit board in electrical communication with the first input terminal of the at least one electrically operable component, preferably the electrical device comprises a flex circuit, the flex circuit comprising a substrate having a first major surface and an opposing second major surface, the first or second major surface of the substrate of the flex circuit comprising a first electrical connector region thereon in electrical communication with a second electrical connector region on the first or second major surface of the substrate of the flex circuit by means of an electrically conductive track, the first electrical connector region on the substrate of the flex circuit being in electrical and mechanical communication with the first electrical connector region on the first circuit board such that upon bringing the second input terminal of the at least one electrically operable component into electrical communication with a first output terminal of a suitable power supply and bringing the second electrical connector region of the flex circuit into electrical communication with a second output terminal of the suitable power supply, electrical power is provided to the at least one electrically operable component.

Preferably the first electrical connector region of the flex circuit and the second electrical connector region of the flex circuit are on the second major surface of the substrate of the flex circuit, and preferably the first electrical connector region of the flex circuit is in electrical communication with the second electrical connector region of the flex circuit by an electrically conductive track on the second major surface of the substrate of the flex circuit.

Preferably the substrate of the flex circuit comprise a third electrical connector region on the first or second major surface of the substrate of the flex circuit in electrical communication with a fourth electrical connector region on the first or second major surface of the substrate of the flex circuit by means of an electrically conductive track, the third electrical connector region on the substrate of the flex circuit being in electrical and mechanical communication with a second electrical connector region on the first circuit board, the second electrical connector region on the first circuit board being in electrical communication with the second input terminal of the at least one electrically operable component, wherein upon bringing the fourth electrical connector region of the flex circuit into electrical communication with a first output terminal of a suitable power supply and bringing the second electrical connector region of the flex circuit into electrical communication with a second output terminal of the suitable power supply, electrical power is provided to the at least one electrically operable component.

Preferably the third electrical connector region of the flex circuit and the fourth electrical connector region of the flex circuit are on the second major surface of the substrate of the flex circuit, and preferably the third electrical connector region of the flex circuit is in electrical communication with the fourth electrical connector region of the flex circuit by an electrically conductive track on the second major surface of the substrate of the flex circuit.

Preferably the second major surface of the substrate of the flex circuit faces the first major surface of the first circuit board.

Preferably the second major surface of the substrate of the flex circuit is in direct contact with at least a portion of the first major surface of the first circuit board.

Preferably a temporary adhesive means is between at least a portion of the first major surface of the first circuit board and the second major surface of the substrate of the flex circuit, preferably wherein the temporary adhesive means is a restickable adhesive.

In some embodiments the electrical device is part of an interlayer ply, the interlayer ply being suitable for joining two sheets of glass together, wherein the interlayer ply comprises a sheet of interlayer material having a first major surface and a second opposing major surface, there being an aperture in the sheet of interlayer material, the aperture having a wall extending between the first and second major surfaces of the sheet of interlayer material, the electrical device being positioned in the aperture in the sheet of interlayer material and bonded to at least a portion of the wall of the aperture and/or at least a portion of the first and/or second major surface of the sheet of interlayer material.

Preferably the sheet of interlayer material comprises polyvinyl butyral (PVB), a copolymer of ethylene, such as ethylene vinyl acetate (EVA) or polyurethane, in particular a thermoplastic polyurethane (TPU).

When the electrical device is part of an interlayer ply, the interlayer ply may be incorporated into a laminated glazing such that the interlayer ply is between first and second sheets of glazing material such as glass, by using suitably high temperature and pressure lamination conditions as are well known in the art. There may be one or more other ply of interlayer material (with or without an electrical device incorporated in an aperture therein) between the electrical device and the first and/or second sheet of glazing material.

When the electrical device is part of an interlayer ply, the interlayer ply may be laminated to a single sheet of glazing material such as glass for subsequent use in a window, which may require the electrical device in the interlayer ply to be laminated to a second sheet of glazing material, such as glass, or the single sheet of glazing material with the interlayer ply laminated thereto may be used as a pane in a window, for example a window with one pane or two or more panes such as an insulated glazing unit.

The invention will now be described with reference to the following figures (not to scale) in which, FIG. 1 shows a schematic isometric representation of an electrically operable device useful in the present invention;

FIG. 3b shows a schematic plan view of the electrically operable device on the sheet of interlayer material as shown in FIG. 3a;

FIG. 4b shows a schematic plan view of the electrically operable device on the sheet of interlayer material covered with the layer of liquid plastic as shown in FIG. 4a;

FIG. 5b shows a schematic plan view of the electrically operable device on the sheet of interlayer material covered with the uniform layer of liquid plastic as shown in FIG. 5a;

FIG. 6b shows a schematic plan view of the child electrical device cut from the larger parent electrical device as shown in FIG. 6a;

FIGS. 7a, 7b and 8-12 show multiple electrically operable devices on a sheet of interlayer material and illustrate manufacturing steps to make a parent electrical device from which child electrical devices may be cut therefrom;

Figure 13A:
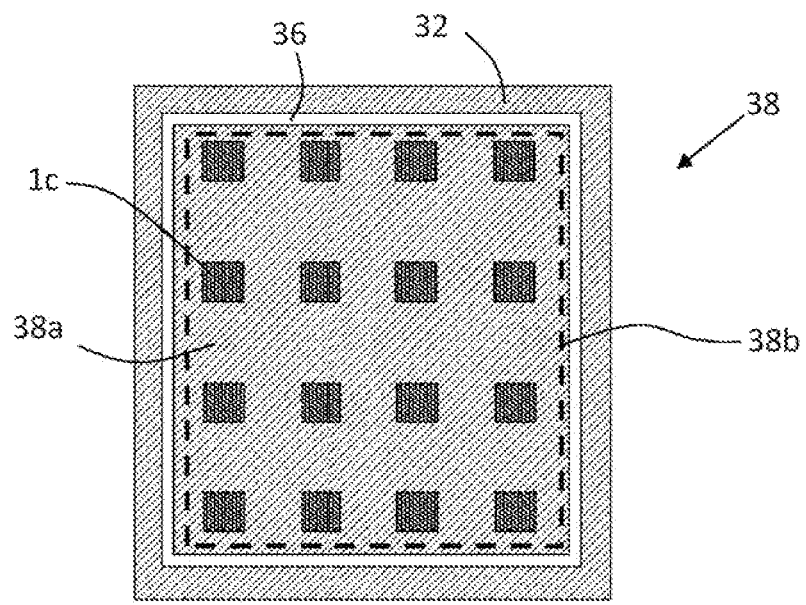
Figure 13B:
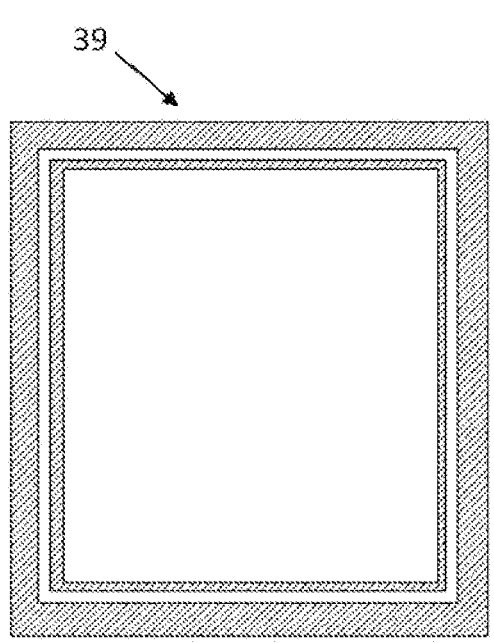
Figure 13C:
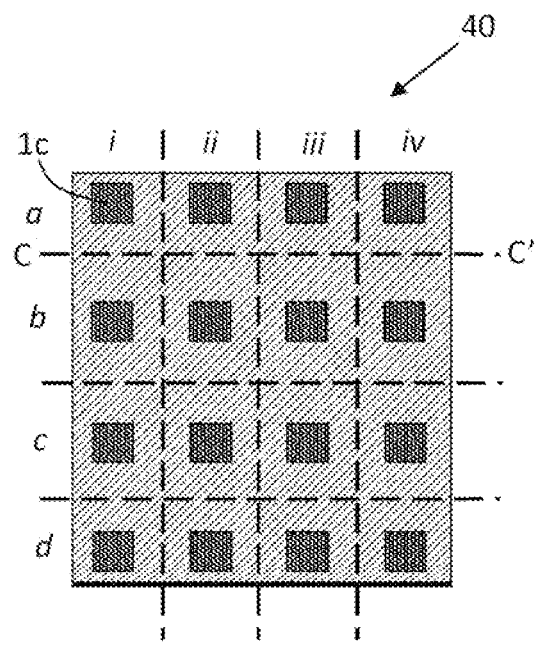
Figure 14A:
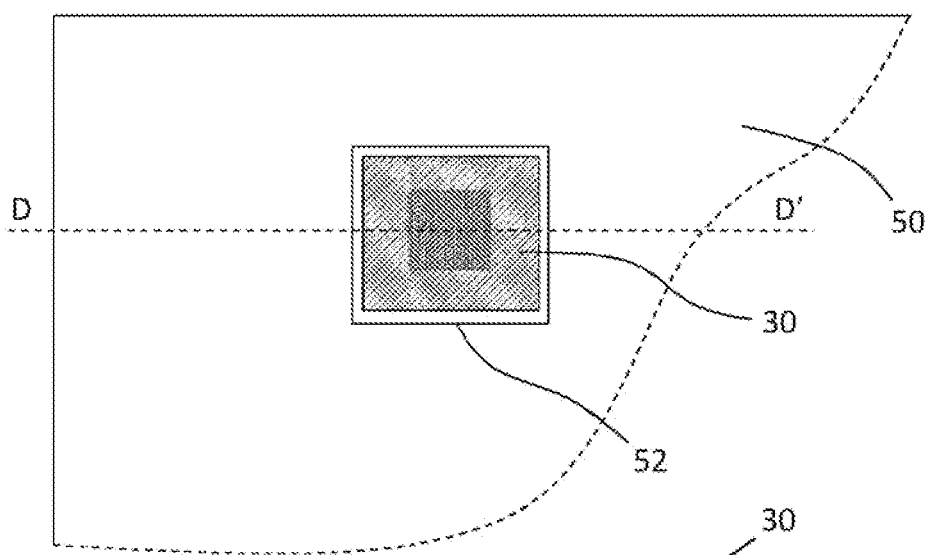
Figure 14B:
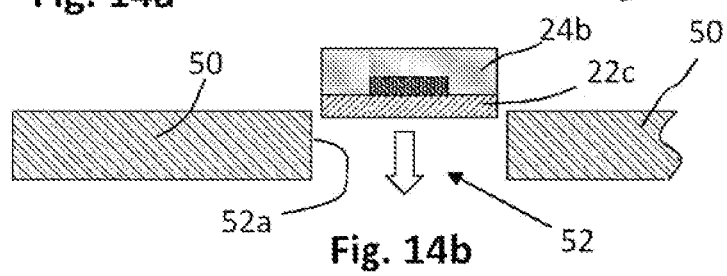
Figure 15:
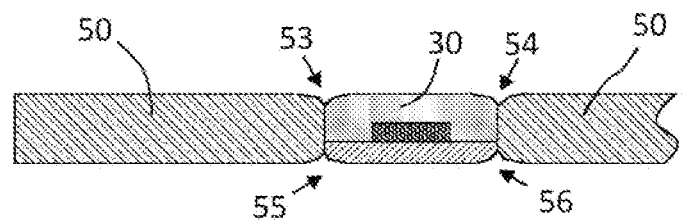
Figure 16:
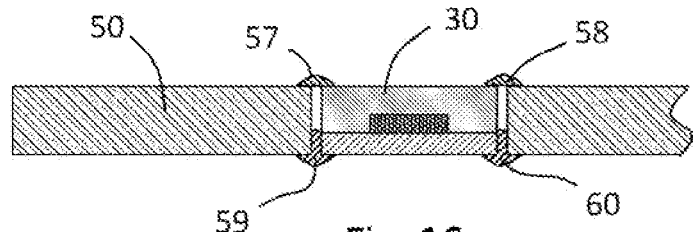
Figure 17:
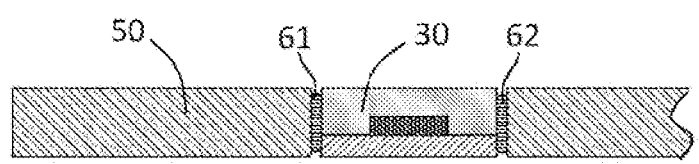
Figure 21:
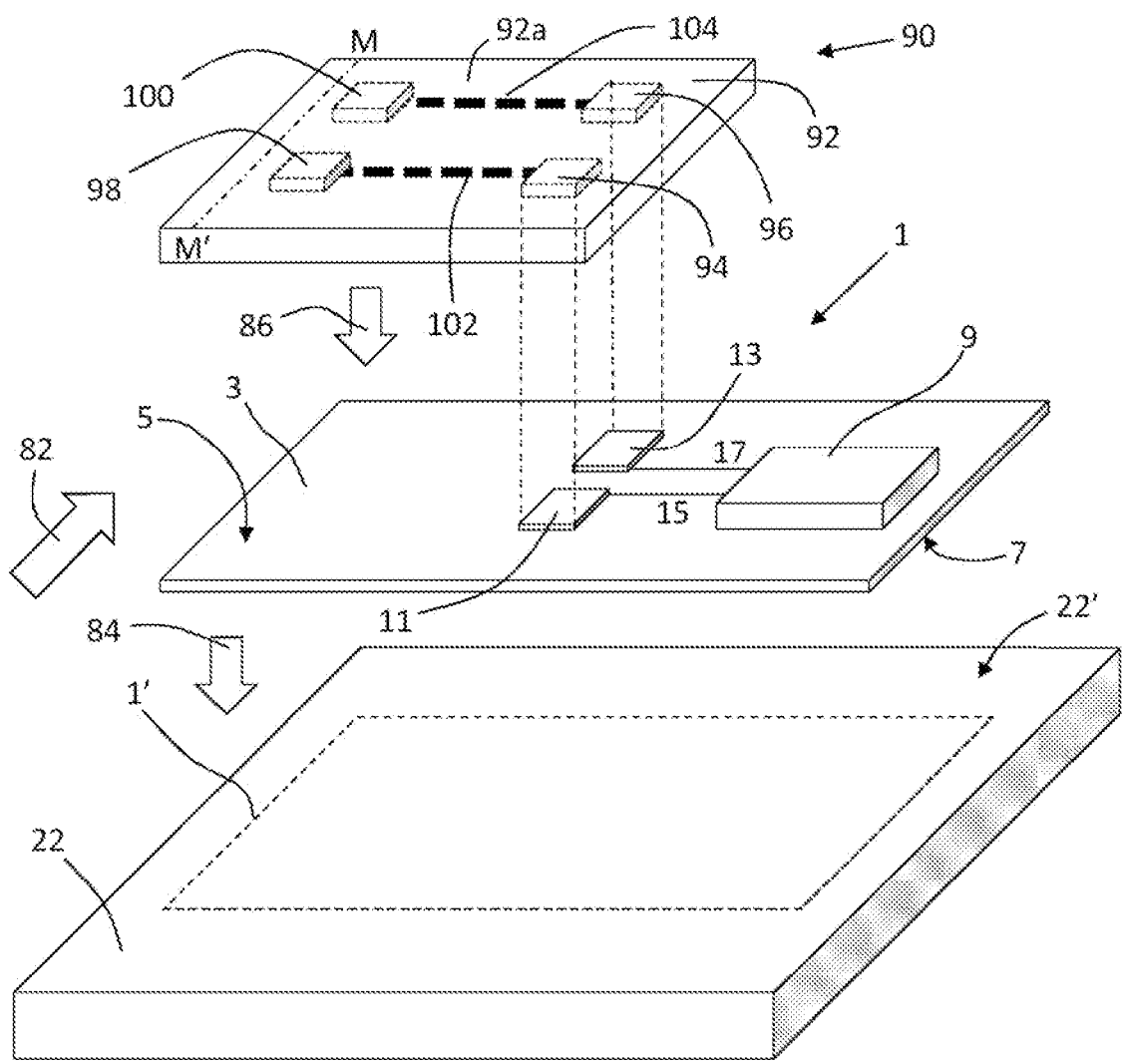
Figure 22:
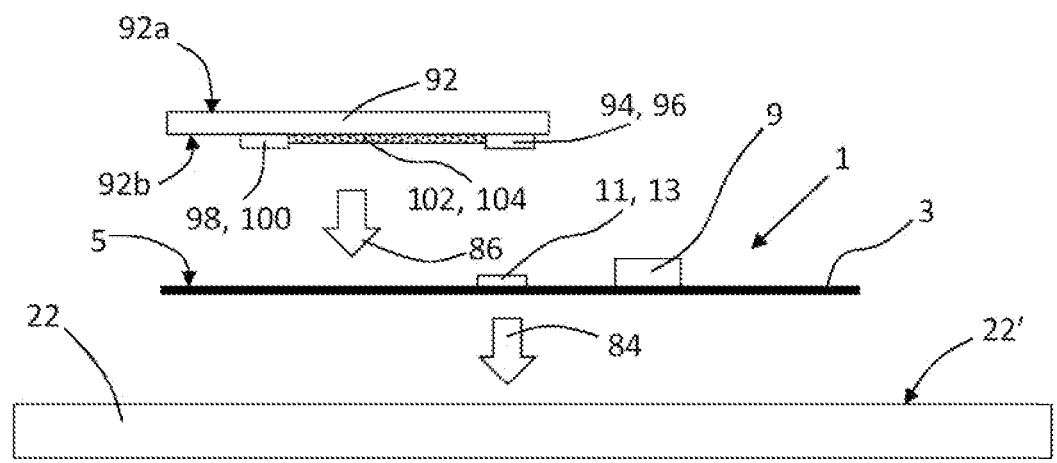
Figure 23:
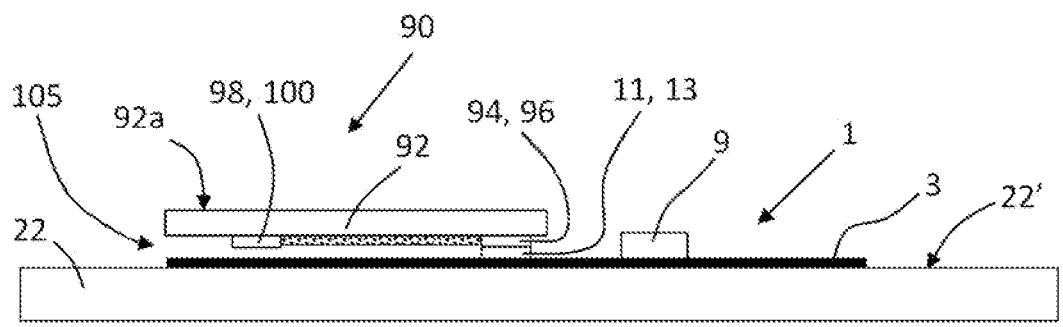
Figure 24:
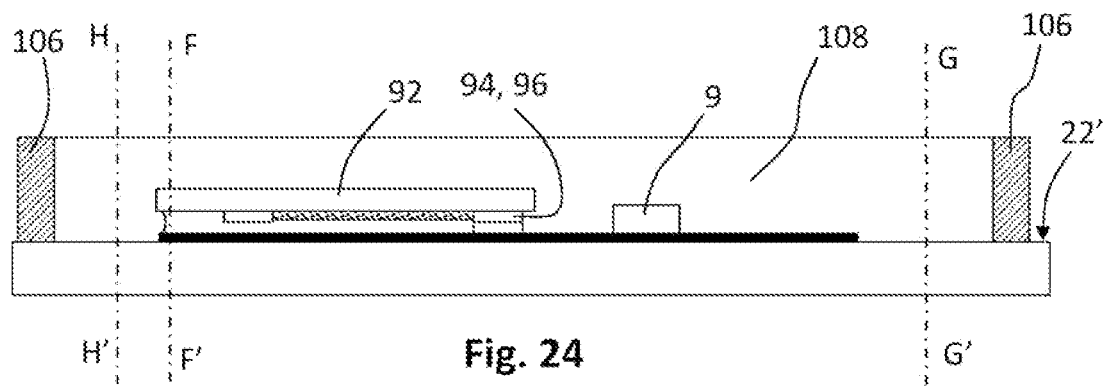
Figure 25A:
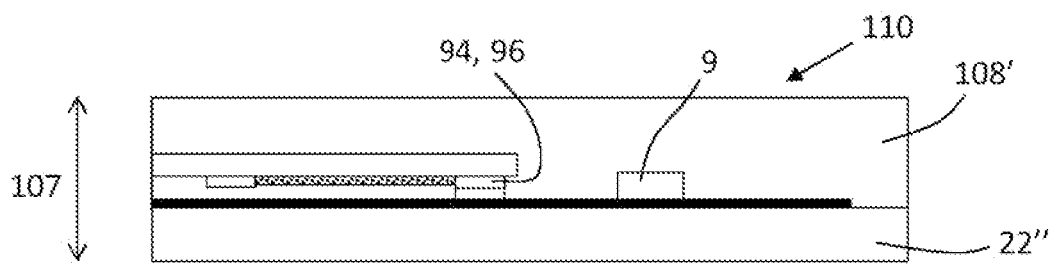
Figure 25B:
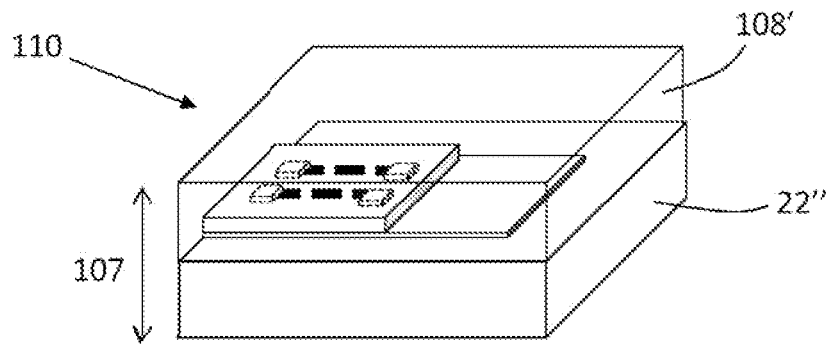
Figure 26A:
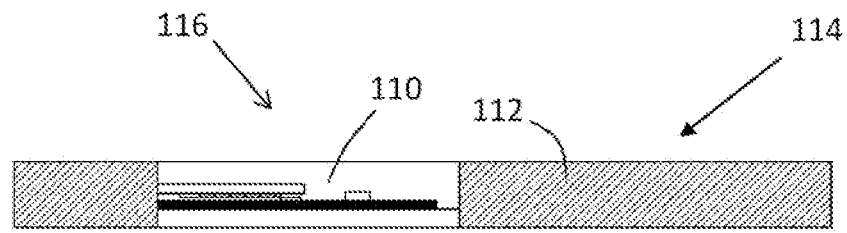
Figure 26B:
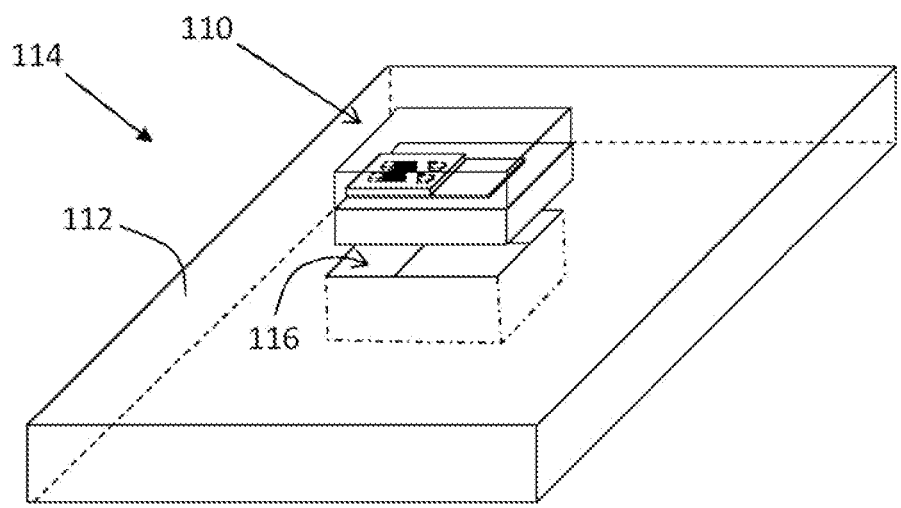
Figure 27:
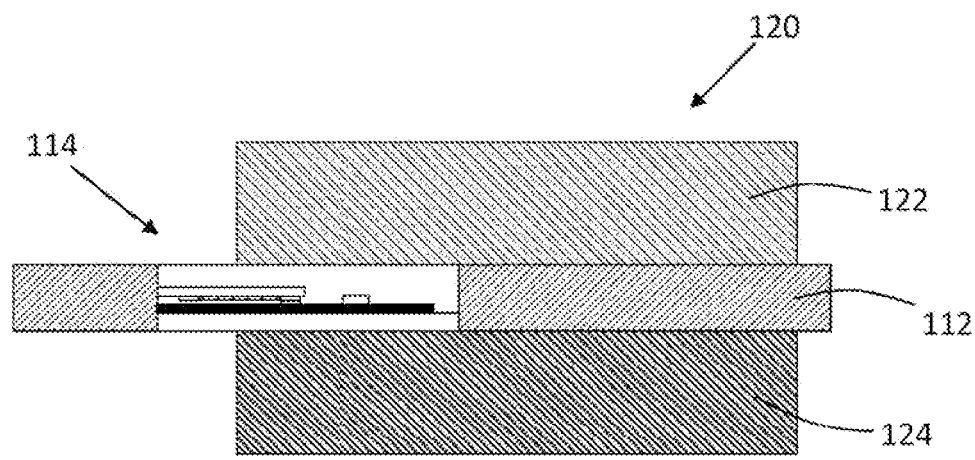
Figure 28:
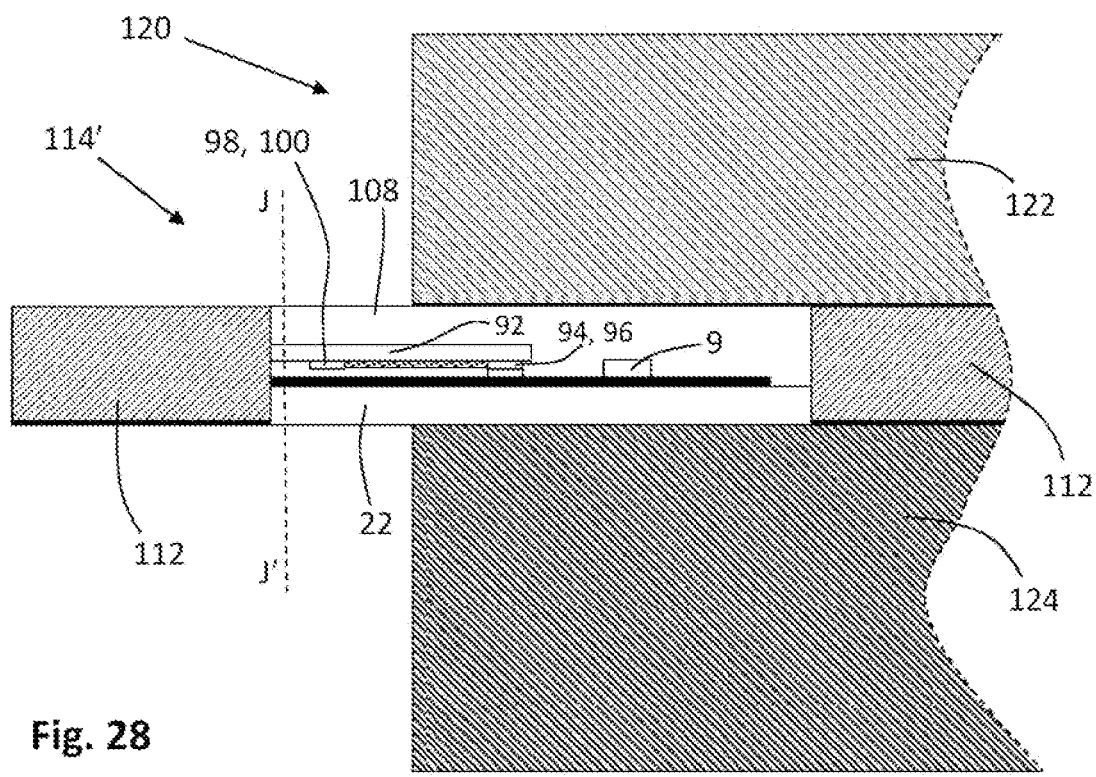

FIGS. 13a-c are schematic plan views of sixteen electrically operable devices encapsulated in a layer of plastic and the subsequent removal therefrom;

FIGS. 14a and 14b illustrates how an electrical device is positioned in an aperture in a sheet of interlayer material;

FIGS. 15-17 show how an electrical device may be fixed in an aperture in a sheet of interlayer material to make an interlayer ply in accordance with an aspect of the present invention;

FIGS. 18a, 18b, 19a, 19b, 20a and 20b show schematic side view and exploded side views of different laminated glazings incorporating two glass sheets and an interlayer ply according to an aspect of the present invention;

FIG. 21 is a schematic exploded isometric representation of an electrically operable device between a sheet of interlayer material and a flex circuit useful in providing power to the electrically operable device;

FIG. 22 is a schematic side representation of FIG. 21;

FIG. 23 is schematic side representation of FIG. 21 where the electrically operable device is on the sheet of interlayer material and the flex circuit is on the electrically operable device;

FIG. 24 is similar to FIG. 23 except a barrier has been provided on the sheet of interlayer material around the electrically operable device and circuit board, and liquid plastic has been poured into the region bounded by the barrier;

FIG. 25a shows a schematic side representation of an electrical device in accordance with an aspect of the present invention;

FIG. 25b shows a schematic isometric representation of the electrical device shown in FIG. 25a;

FIG. 26a shows a schematic side representation of an interlayer ply consisting of the electrical device shown in FIGS. 25a and 25b incorporated in an aperture in a sheet of interlayer material;

FIG. 26b shows a schematic isometric representation of FIG. 26b;

FIG. 27 shows a schematic side representation of the interlayer ply of FIG. 26a incorporated in a laminated glazing;

FIG. 28 is an enlarged view of a portion of FIG. 27; and

Figure 29:
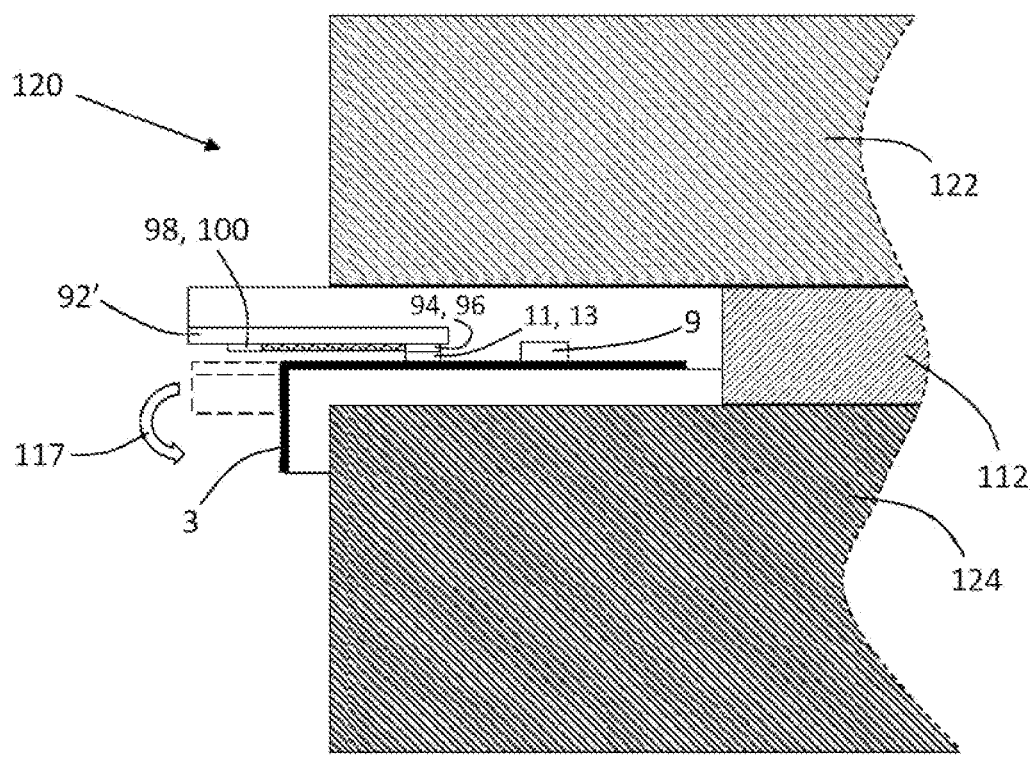

FIG. 29 is a schematic side representation of an end of the laminated glazing shown in FIG. 27 illustrating how the flex circuit may be used to provide electrical power to the electrically operable component.

Figure 1:
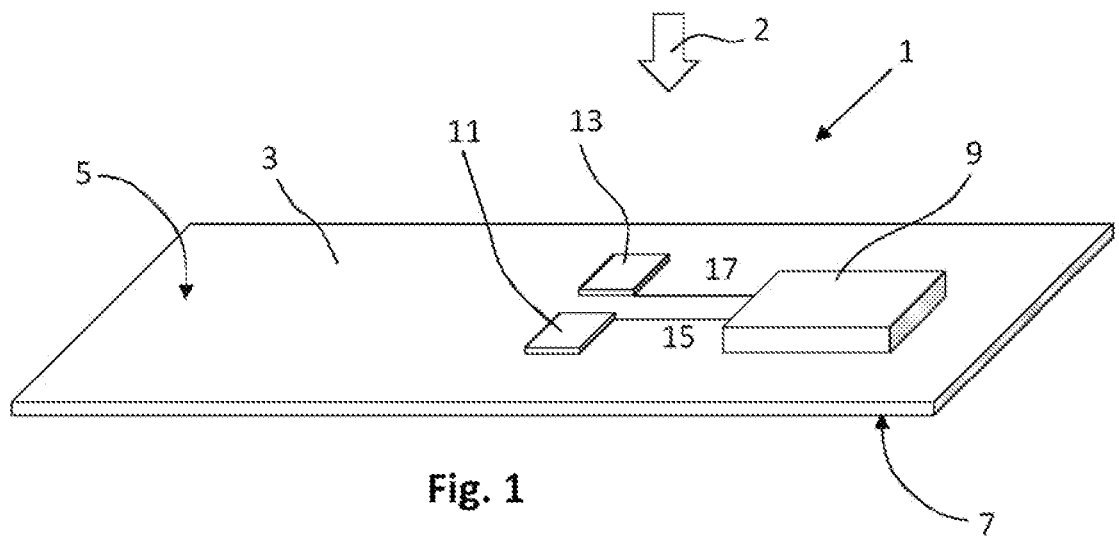
Figure 2:
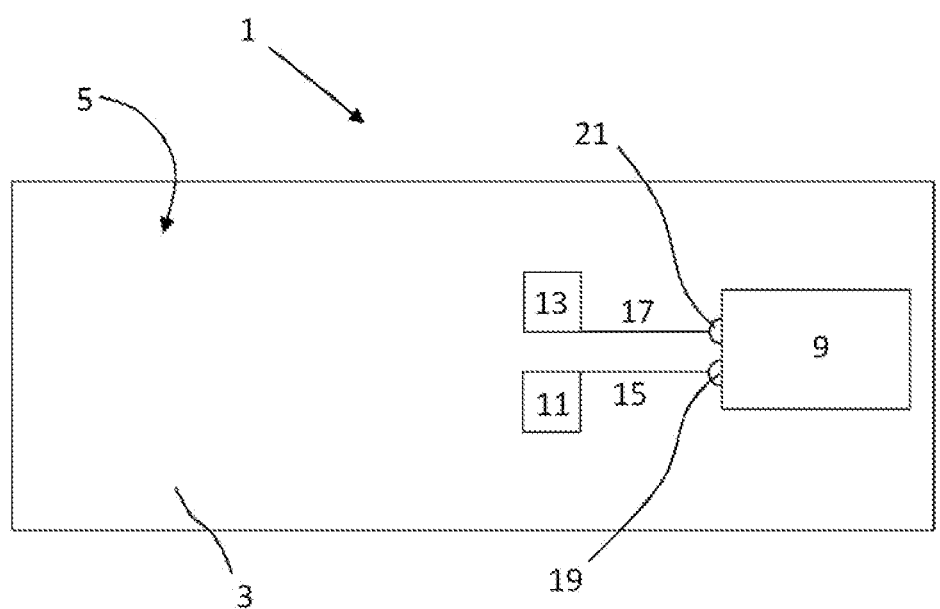
FIG. 2 shows a plan view of the electrically operable device shown in FIG. 1.

FIG. 1 shows a schematic isometric representation of an electrically operable 1 device useful in the present invention. FIG. 2 is a plan view of the electrically operable device 1 when viewed in the direction of arrow 2.

The electrically operable device 1 comprises a substrate 3 having a first major surface 5 and an opposing second major surface 7. On the first major surface 5 of the substrate 3 is an electrically operable component 9, such as a light emitting diode or sensor. Also, on the first major surface 5 of the substrate 3 are first and second electrical connector regions 11, 13. The first electrical connector region 11 is in electrical communication with first input terminal 19 of the electrically operable component 9 via a first electrically conductive track 15. The second electrical connector region 13 is in electrical communication with second input terminal 21 of the electrically operable component 9 via a second electrically conductive track 17.

Upon connecting the first electrical connector region 11 and the second electrical connector region 13 to the output terminals of a suitable power supply, electrical power may be provided to the electrically operable component 9 thereby switching the electrically operable component from an unenergized state to an energized state. For example, when the electrically operable component 9 is a light emitting diode and the first electrical connector region 11 is connected to the positive terminal of a suitable power supply and the second electrical connector region 13 is connected to the negative terminal of the suitable power supply, electrical power is supplied to the light emitting diode 9 and light is emitted therefrom. Upon disconnecting from the suitable power supply, light is no longer emitted from the light emitting diode. Suitable switching means may be included as part of the electrically operable device 1 or separate thereto to allow the switching of a suitable power supply.

There may be one or more electrically operable components 9 mounted on the substrate 3.

The substrate 3 with at least the one electrically conductive track on a major surface thereof is a circuit board. For example, the substrate 3 with the first and second electrical connector regions 11, 13 and the first and second electrically conductive tracks 15, 17 on the first major surface 5 of the substrate 3 is a circuit board.

In FIG. 1, the arrow 2 is normal to the first major surface 5.

The substrate 3 is typically optically transparent and may be a plastic material such as polyethylene terephthalate (PET). In the example shown in FIGS. 1 and 2, the substrate is PET having a thickness of about 0.2 mm and is relatively flexible.

The first electrically operable component 9 may be mounted on the first major surface 5 of the substrate 3 by means of a suitable adhesive. The first and second electrical connector regions 11, 13 and the first and second electrically conductive tracks 15, 17 may be in the form of an electrically conductive ink that has been provided on the first major surface 5 by means of a screen-printing process or the like.

The electrically operable component 9 may be mounted on the second major surface 7 of the substrate 3 and at least one of the electrically conductive tracks 15, 17 and/or the electrically connector regions 11, 13 may also be on the second major surface 7. For example, if the electrically operable component 9 is on the second major surface 7 of the substrate 3 and the first electrical connector region 11 is on the first major surface 5 of the substrate 3, the first electrically conductive track 15 passes between the first and second major surfaces 5, 7 of the substrate 3 through a suitable opening therein.

Instead of electrically conductive tracks 15, 17 electrically isolated coated regions may be in electrical communication with an electrical connector region and an input terminal of the electrically operable component 9. For example, the substrate 3 may be a coated substrate having an electrically conductive coating thereon, for example on the first major surface 5. In such an example the electrically conductive coating on the first major surface 5 may have two electrically isolated regions, a first electrically isolated region in electrical communication with the first input terminal 19 of the electrically operable component and a second electrically isolated region in electrical communication with the second input terminal 21 of the electrically operable component. Each electrically isolated region of the coating may in in electrical communication with a respective electrical connector region.

FIGS. 3-6 are used to illustrate steps involved in making an electrical device in accordance with an aspect of the present invention. In each of the FIGS. 3-6, the respective figure "a" is a side view and the respective figure "b" is a plan view thereof i.e. a cross-sectional view along the line Z-Z'.

Figure 3A:
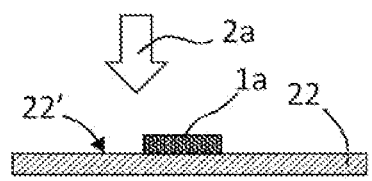
FIG. 3a shows a schematic side view of an electrically operable device on a sheet of interlayer material.
Figure 3B:
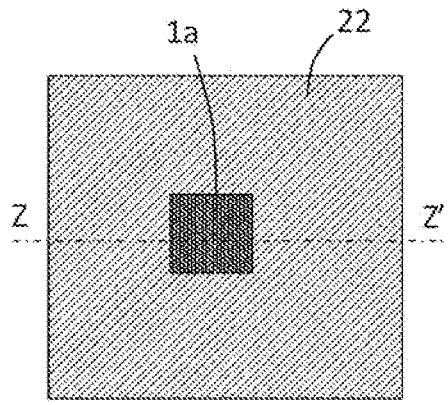
Figure 4B:
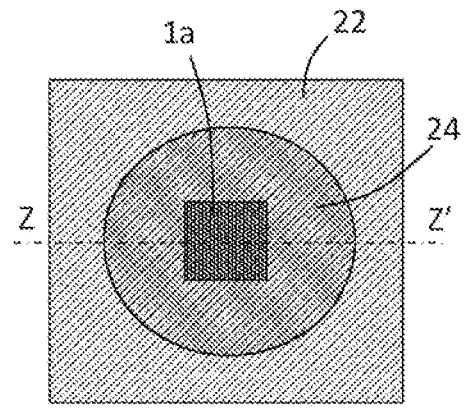

FIG. 3a shows a schematic view of an electrically operable device 1a of the type shown in FIGS. 1 and 2 positioned on a major surface 22' of a sheet of interlayer material 22, which in this example is a sheet of ethylene vinyl acetate (EVA) having a thickness of about 0.2 mm. FIG. 3b shows a plan view of FIG. 3a i.e. a view in the direction of arrow 2a, said arrow being normal to the major surface 22'. In FIG. 3a the electrically operable device 1a is not yet fixed to the sheet of EVA 22. However, the electrically operable device 1a may be fixed to the sheet of EVA 22 by using a suitable adhesive.

Figure 4A:
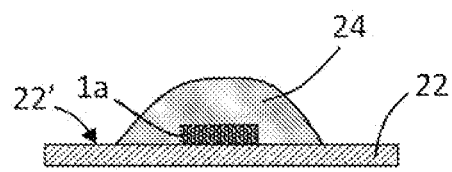
FIG. 4a shows a schematic side view of an electrically operable device on a sheet of interlayer material covered with a layer of liquid plastic.

FIG. 4 is used to illustrate another step in the production of an electrical device in accordance with an aspect of the present invention. An assembly of sheet of EVA 22 with electrically operable device 1a thereon is provided and a layer 24 of liquid adhesive, which is EVA in this example, is deposited (i.e. by pouring) over the electrically operable device 1a, thereby covering the electrically operable device 1a and also contacting a portion of the major surface 22' of the sheet of EVA 22. Other suitable materials for the layer 24 include suitable resins or epoxy materials, which may be multi-component epoxy materials.

In this example the layer 24 of liquid EVA may be applied using a hot glue gun or similar, the EVA initially being in solid form and then being melted for subsequent deposition on the electrically operable device 1a as described above.

Due to the viscosity of the EVA, the layer 24 is not of uniform thickness relative to the sheet of EVA 22 (or the major surface 22' of the sheet of EVA 22), instead the layer has a convex surface and may be referred to as a "blob" in the art i.e. a blob of liquid EVA covering the electrically operable device 1a. In plan view shown in FIG. 4b, the blob of liquid EVA is shown having a circular periphery, but the shape of the periphery of the blob of liquid EVA may be non-circular.

Figure 5A:
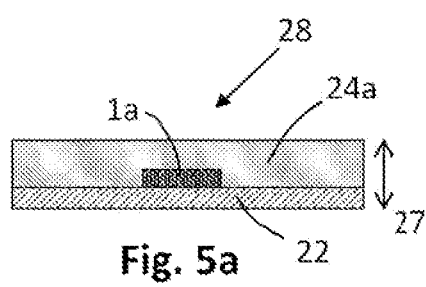
FIG. 5a shows a schematic side view of an electrically operable device on a sheet of interlayer material covered with a uniform layer of plastic.
Figure 5B:
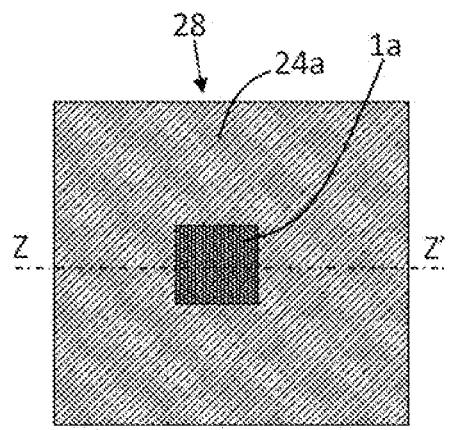

FIG. 5 is used to illustrate a subsequent step in the production of an electrical device in accordance with an aspect of the present invention. Prior to the solidification of the layer 24 of liquid EVA, levelling means are applied to flatten the layer 24 to provide layer 24a of liquid EVA having a uniform (or substantially uniform) thickness relative to the sheet of EVA 22. In this example the layer 24a has a thickness of 0.56 mm such that the thickness 27 is about 0.76 mm.

The layer 24a of liquid EVA is cured to form a solid layer of EVA. The layer 24a of solid EVA adheres and fixes the electrically operable device 1a to the sheet of EVA 22, i.e. encapsulating the electrically operable device on the sheet of EVA 22.

In the form shown in FIG. 5a, once the layer 24a is a layer of solid EVA, the assembly of sheet of EVA 22 with electrically operable device 1a fixed thereto by means of layer 24a of solid EVA may be used as an electrical device 28 in accordance with an aspect of the present invention. However, it is preferred to use an additional processing step to reduce the dimensions of the electrical device 28 for subsequent use as will be described in more detail hereinafter. In this way, the electrical device 28 is a parent electrical device from which a child electrical device may be produced therefrom.

Figure 6A:
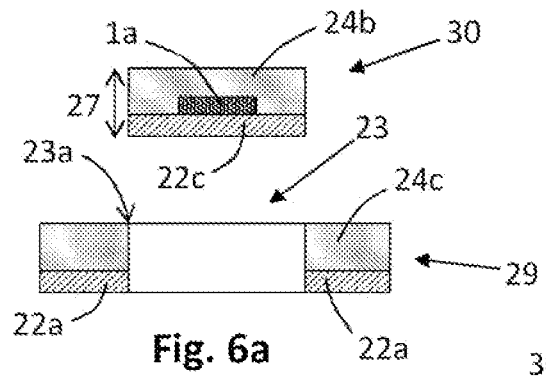
FIG. 6a shows a schematic side view of a child electrical device cut from a larger parent electrical device.
Figure 6B:
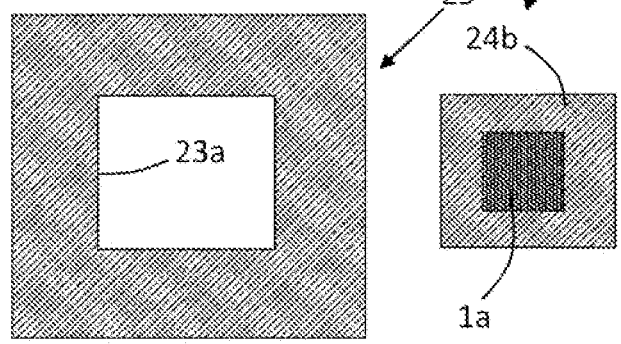

FIG. 6 is used to illustrate another step in the production of an electrical device in accordance with an aspect of the present invention.

With reference to FIG. 5 and FIG. 6, starting with the electrical device 28 (which is a parent electrical device), a smaller electrical device 30 (a child electrical device) may be removed therefrom by cutting, punching etc.

In this example, using a knife the electrical device 30 was cut from the parent electrical device 28 to leave a hole (or aperture) 23 that extends through the solidified layer of EVA 24a and sheet of EVA 22. Given that that the electrically operable device 1a has been removed, the portion 29 which consists of a portion 22a of the sheet of EVA 22 with a portion 24c of the solidified layer of EVA 24a bonded thereto, is no longer is able to function as an electrical device and is surplus and may be discarded.

The electrical device 30 that has been removed from the original electrical device 28 consists of a portion 24b of the solidified layer of EVA 24a covering the electrically operable device 1a and bonded thereto. The portion 24b is also bonded to the portion 22c of the sheet of EVA 22. The thickness of the electrical device 30 is shown by arrow 27 and in this example is about 0.76 mm (the same as the electrical device 28).

The electrical device 30 has smaller external dimensions that the electrical device 28 and so is a child electrical device.

Although in FIGS. 3-6 only one electrically operable device 1a is shown positioned on the sheet of EVA 22, there may be two or more such devices positioned on the sheet of EVA 22. In such examples, the layer 24 of liquid may extend over all the electrically operable devices, or there may be one or more such layers of liquid covering each electrically operable device i.e. each electrically operable device may be covered by a respective layer of liquid, and two or more of the respective layers of liquid may be isolated from each other.

Figure 7A:
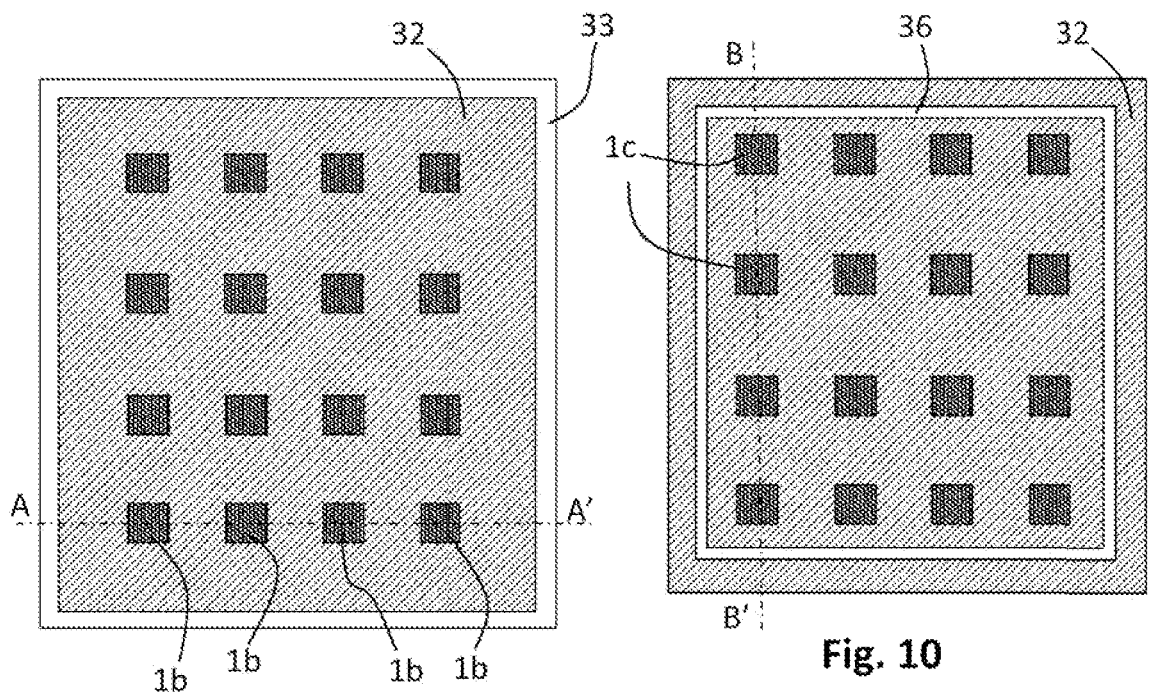
Figure 7B:
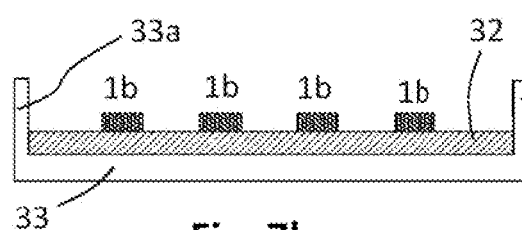
Figure 8:
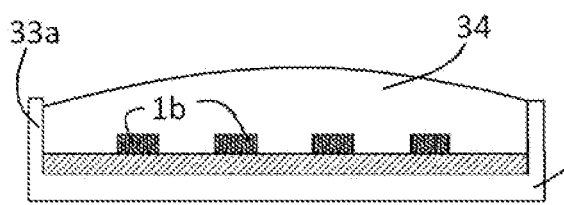
Figure 9:
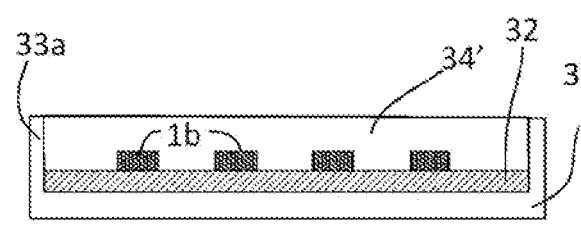

FIGS. 7-9 show an example where multiple electrically operable devices 1b (of the type shown with reference to FIGS. 1 and 2) are positioned on a sheet of suitable interlayer material such as EVA. In this example there are sixteen electrically operable devices 1b.

With reference to FIG. 7, FIG. 7a shows a schematic plan view of sheet of EVA 32 located in the bottom of a suitable tray 33. Positioned on the sheet of EVA 32 are sixteen electrically operable devices, only four of which are labelled 1b and are of the type described with reference to FIGS. 1 and 2. There may be more or less electrically operable devices on the sheet of EVA 32. The electrically operable devices may be of the same type or different. In this example the electrically operable devices are positioned on the sheet of EVA 32 in a grid like manner, although the electrically operable devices may be positioned on the sheet of EVA 32 in any other configuration, which may be random.

FIG. 7b shows a cross-sectional view of the assembly shown in FIG. 7a through the line A-A'. The sheet of EVA 32 has a thickness of about 0.2 mm and rests flat against the bottom of the tray 33.

The tray 33 has a peripheral wall 33a extending upwards from the base of the tray by about 0.76 mm.

FIG. 8 shows a schematic representation of the assembly shown in FIG. 7b when a volume of liquid plastic has been deposited in the tray to cover the electrically operable devices 1b and the exposed portion of the sheet of EVA 32 (i.e. those portions of the sheet of EVA 32 with no electrically operable device thereon). The volume of liquid plastic forms a layer 34 and due to the viscosity thereof thickness of the layer 34 may not be uniform relative the sheet of EVA 32. Suitable levelling means may be used to level the liquid to the height of the peripheral walls 33a of the tray 33, as shown in FIG. 9. The liquid plastic can then be cured to form a solid layer of plastic 34' that encapsulates the electrically operable devices 1b. In this example the combined thickness of the sheet of EVA 32 and the solid layer 34' is about 0.76 mm and is essentially set by the height of the peripheral walls 33a of the tray 33.

Whilst FIG. 9 may be used to illustrate the assembly of FIG. 8 once the liquid forming the layer 34 has been levelled, the same figure may be used to illustrate an assembly wherein the liquid forming the layer 34' has relatively low viscosity so that once the liquid has been deposited (i.e. by pouring), into the tray to cover the electrically operable devices 1b and the sheet of EVA 32, the liquid self-levels to the height of the peripheral walls 33a of the tray 33.

Each electrically operable device 1b may then be removed from the assembly shown in FIG. 9 by suitable cutting, punching etc. It may not be possible to remove portions of the base of the tray 33 from the electrical devices so produced in this manner. Also, the solidified layer of liquid in the region of the peripheral walls 33a of the tray will adhere thereto making separation therefrom difficult.

FIG. 10 shows a step in an alternative method of carrying out an aspect of the present invention.

In FIG. 10, the sheet of EVA 32 has been placed on a suitable support i.e. a table (not shown). Electrically operable devices 1c (only two thereof are labelled) are then positioned in the desired locations on the sheet of EVA 32.

A suitable barrier 36 is then positioned on the sheet of EVA 32 around the electrically operable devices positioned on the sheet of EVA 32. The barrier 36 may be positioned on the sheet of EVA 32 before the electrically operable devices are positioned thereon, in which case the electrically operable devices are positioned on the sheet of EVA 32 inboard of the barrier 36.

The barrier 36 may be formed of any suitable material i.e. plastic, polyethylene, polycarbonate, and is suitably bonded to the upper surface of the sheet of EVA 32, preferably forming a seal therewith. The barrier 36 may be of unitary construction or formed from two or more segments suitable joined together.

Figure 11:
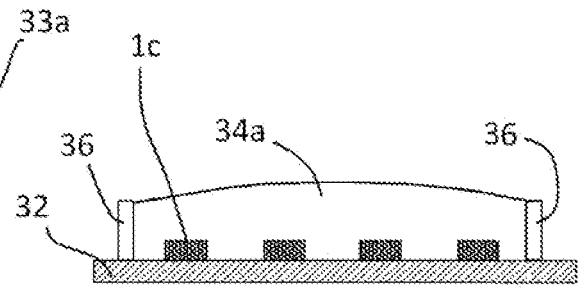
Figure 12:
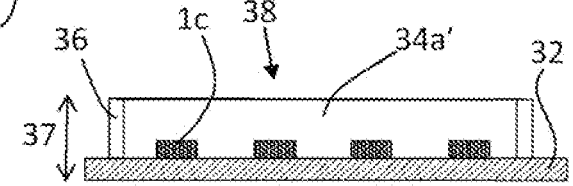

FIG. 11 shows the assembly shown in FIG. 10 when a suitable liquid adhesive has been poured into the region bounded by the barrier 36. The liquid adhesive forms a layer 34a that covers the electrically operable devices 1c and the sheet of EVA 32. Depending upon the viscosity of the liquid adhesive forming layer 34a it may be required to level said liquid to form a uniform thickness layer 34a' as shown in FIG. 12. The layer 34a subsequently cures to form a solid layer 34a' that encapsulates the electrically operable devices 1c that are positioned on the sheet of EVA 32. Alternatively, the liquid may have low viscosity in which case an additional levelling step is not required. If desired, the layer 34a may not be levelled prior to being solidified, where after being solidified the layer 34a is made a uniform thickness by using a suitable abrasive means or cutting.

FIG. 12 shows the assembly 38 of sheet of EVA 32 having sixteen electrically operable devices 1c encapsulated by solid layer 34a' and being bounded by barrier 36. The assembly 38 may be used as an electrical device in accordance with an embodiment of the present invention. However, it is preferred to remove one or more of the electrically operable devices 1c from the assembly 38 for subsequent use as will be described hereinafter i.e. the electrical device 38 is a parent electrical device for the subsequent production of child electrical devices therefrom.

FIG. 13a shows a plan view of the assembly 38 shown in FIG. 12. The assembly 38 is used as a parent electrical device to prepare sixteen child electrical devices, each child electrical device being similar to the electrical device 30 shown in FIG. 6.

The sixteen encapsulated electrically operable devices 1c (only one of which is labelled in FIG. 13a) are inboard of the barrier 36 in a central region 38a of the assembly 38. The central region 38a is removed from the assembly 38 by cutting along a line 38b just inboard of the barrier 36 but spaced apart from the electrically operable devices 1c. Using a suitable cutting step (such as laser cutting, mechanical cutting or thermal cutting etc.) the central region 38a of the assembly 38 may be removed to leave a portion 39 that contains no electrically operable devices, as shown in FIG. 13b. The removed portion 40 shown in FIG. 13c contains the sixteen encapsulated electrically operable devices 1c (only one of which is labelled in this figure).

In this example, as shown in FIG. 13c, the electrically operable devices are arranged in linear rows and columns. There are four rows a, b, c and d and four columns i, ii, iii and iv. Each electrically operable device 1c may be removed from the portion 40 by cutting along the dotted lines shown in FIG. 13c, for example row a may be removed from the portion 40 by cutting along dotted line C-C'.

In this example the rows a and d are the same height and the rows b and c are the same height. The columns i, ii, iii and iv each have the same width, but they may be different. The rows a, b, c, d may each have the same height.

By cutting along the dotted lines shown in FIG. 13c, sixteen electrical devices of the type labelled 30 in FIG. 6 are produced for subsequent use. Each electrical device so obtained is a child electrical device because it was produced from the assembly 38 (which is a parent electrical device).

FIG. 14 is used to illustrate how an electrical device 30 of the type shown in FIG. 6 may be used to form an interlayer ply comprising electrical device 30 and a sheet of interlayer material 50 in accordance with an aspect of the present invention. FIG. 14a is a plan view and FIG. 14b is a cross-sectional view along the line D-D'. As is evident from the above, the electrical device 30 may be a child electrical device produced from an assembly of the type shown in FIG. 13.

An aperture 52 is made in the sheet of interlayer material 50 to leave a void therein. In this example the void extends between both major surfaces of the sheet of interlayer material 50, but the void may not extend between both the major surfaces of the sheet of interlayer material 50. The aperture 52 has a wall 52a extending between major surfaces of the sheet of interlayer material 50.

The sheet of interlayer material 50 with the aperture 52 therein is placed on a suitable support i.e. a table (not shown). The electrical device 30 is then positioned in the aperture 52. The outer dimensions of the electrical device are slightly smaller than the major dimensions of the aperture 52 such that the electrical device is not fixed within the aperture 52.

The electrical device 30 has been made such that the thickness thereof (see label 27 on FIG. 6) is the same, or substantially the same, as the thickness of the sheet of interlayer material 50, which may be between 0.38 mm and 0.76 mm.

In accordance with an aspect of the present invention, the electrical device 30 is fixed in the aperture 52 in the sheet of interlayer material 50 using suitable bonding means.

In the embodiment shown in FIG. 15, a source of localised heating is applied to the upper edge of the aperture 52 and/or the electrical device 30, i.e. in the regions indicated by labels 53, 54. The localised heating causes the interlayer material 50 to soften and/or melt locally, thereby allowing the upper portion of the electrical device 30 to be bonded to the wall 52a of the aperture 52. The localised heating applied in the regions 53, 54 may also cause the layer of adhesive 24b to soften and/or melt locally.

Similarly, localised heating may be applied to the lower edge of the aperture 52 and/or electrical device 30, i.e. in the regions indicated by labels 55, 56. Such localised heating may cause the interlayer material 50 and/or the interlayer material 22c to soften and/or melt locally to bond the electrical device in the aperture 52.

In an alternative embodiment as shown in FIG. 16, adhesive is used to bond the electrical device 30 in the aperture 52 in the sheet of interlayer material 50. When the electrical device 30 is located in the aperture 52 in the sheet of interlayer material 50, adhesive 57, 58 may be applied to the upper surface of the sheet of interlayer material 50 to also contact at least a portion of the electrical device 30 to bond the electrical device in the aperture 52. Similarly, adhesive 59, 60 may be applied to the lower surface of the sheet of interlayer material 50.

The adhesive 57, 58 may be applied as a bonding strip (i.e. adhesive tape) connecting the sheet of interlayer material 50 to the electrical device 30. In such embodiments, the bonding strip does not have to extend over the entire major surface of the electrical device 30. However, in an alternative embodiment a sheet having a contact adhesive on a major surface thereof may be used to connect the sheet of interlayer material 50 to the electrical device 30, in which case, the sheet having a contact adhesive thereon may cover the entire electrical device 30 on one side to fix the electrical device 30 in the aperture 52.

As shown in FIG. 16, the adhesive 59, 60 may extend into any gap between the wall 52a of the aperture 52 and the outer wall of the electrical device 30 to provide bonding therebetween. The amount of adhesive 59, 60 that extends into any gap between the wall 52a of the aperture 52 and the outer wall of the electrical device 30 may depend upon the viscosity of the adhesive 59, 60.

FIG. 17 shows another embodiment wherein a layer of adhesive 61, 62 is used to bond the electrical device 30 in the aperture 52 in the sheet of interlayer material 50. The adhesive 61, 62 is applied to the outer walls of the electrical device 30 before the electrical device is positioned in the aperture 52. Thereafter the adhesive 61, 62 contacts the walls 52a of the aperture 52 to bond the electrical device 30 thereto.

As illustrated in FIGS. 14-17, the aim is to use bonding means to fix the electrical device 30 in the aperture 52 in the sheet of interlayer material 50 to make an interlayer ply comprising an electrical device and a sheet of interlayer material. Whilst it is preferred to use a bonding means such as an adhesive to fix the electrical device 30 in the aperture 52 in the sheet of interlayer material, the adhesive may be a restickable adhesive so that the electrical device 30 is removably fixed in the aperture 52.

An interlayer ply having an electrical device 30 fixed in an aperture 52 in a sheet of interlayer material as described above may be used to construct a laminated glazing as illustrated in FIGS. 18, 19 and 20. Each of the FIGS. 18-20 are schematic side representations of glazings.

Figure 18A:
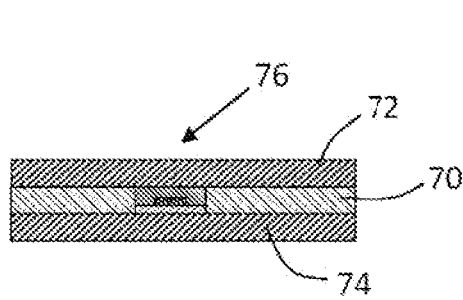

In FIG. 18a there is shown an interlayer ply 70 of the type shown in FIG. 15, 16 or 17 between first and second sheets of glass 72, 74. The interlayer ply 70 joins the first sheet of glass 72 to the second sheet of glass 74. Conventional lamination conditions may be used, for example elevated temperatures and pressure to produce the laminated glazing 76. The interlayer ply 70 provides sufficient adhesive bonding to each of the first and second glass sheets 72, 74 in part because the major surfaces of the electrical device 30 are smaller compared to the major surfaces of the interlayer ply 70. Furthermore, the material forming the major surfaces of the electrical device 30 is itself adhesive.

Suitable glass for the first and second sheets of glass 72, 74 includes soda-lime-silica glass (often referred to as "soda-lime-silicate glass"). A typical soda-lime-silica glass composition is (by weight), $SiO_2$ 69-74%; $Al_2O_3$ 0-3%; $Na_2O$ 10-16%; $K_2O$ 0-5%; MgO 0-6%; CaO 5-14%; SO3 0-2% and $Fe_2O_3$ 0.005-2%. The glass composition may also contain other additives, for example, refining aids and other colourants, which would normally be present in an amount of up to 2%. The transmitted glass colour may be measured in terms of a recognised standard such as BS EN410.

Figure 18B:
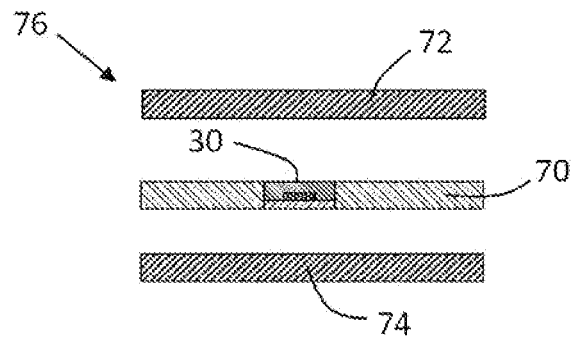

For clarity an exploded representation of the laminated glazing 76 is shown in FIG. 18b.

Figure 19A:
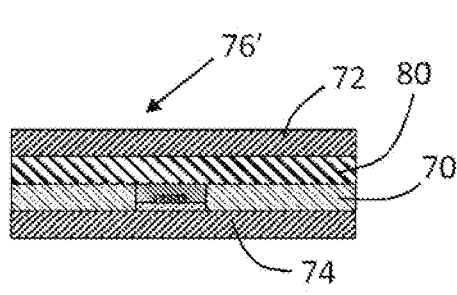

In FIG. 19a there is shown an interlayer ply 70 of the type shown in FIG. 15, 16 or 17 between first and second sheets of glass 72, 74. In addition there is another ply of interlayer material 80 i.e. a ply (or sheet) of PVB, EVA etc. The interlayer ply 80 is between the first sheet of glass 72 and the interlayer ply 70. The interlayer ply 70 is between the second sheet of glass 74 and the interlayer ply 80.

The first sheet of glass 72 is joined to the second sheet of glass 74 by means of an interlayer structure consisting of an interlayer ply 70 made according to the present invention and a conventional ply of interlayer material 80. Conventional lamination conditions may be used, for example elevated temperatures and pressure to produce the laminated glazing 76'.

Figure 19B:
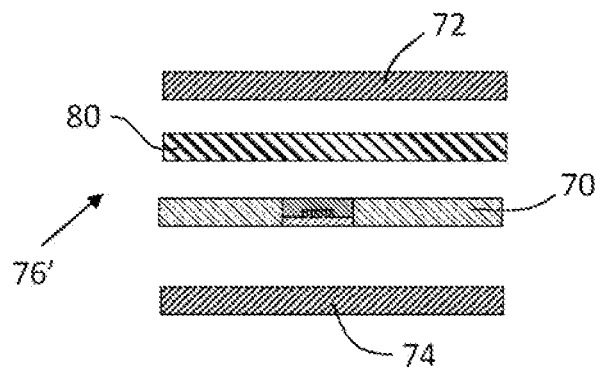

For clarity an exploded representation of the laminated glazing 76' is shown in FIG. 19b.

Figure 20A:
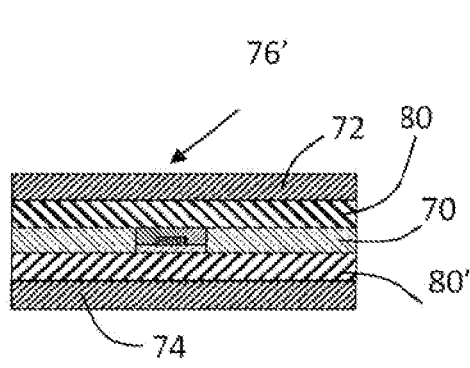

In FIG. 20a there is shown an interlayer ply 70 of the type shown in FIG. 15, 16 or 17 between first and second sheets of glass 72, 74. In addition there is a first ply of interlayer material 80 and a second ply of interlayer material 80' between the first and second sheets of glass 72, 74.

The first interlayer ply 80 is between the first sheet of glass 72 and the interlayer ply 70. The interlayer ply 70 is between the first and second conventional plies of interlayer material 80, 80'. The second interlayer ply 80' is between the interlayer ply 70 and the second sheet of glass 74

The first sheet of glass 72 is joined to the second sheet of glass 74 by means of an interlayer structure consisting of an interlayer ply 70 made according to the present invention, the first ply of interlayer material 80 and the second ply of interlayer material 80' arranged as described above. Conventional lamination conditions may be used, for example elevated temperatures and pressure to produce the laminated glazing 76".

Figure 20B:
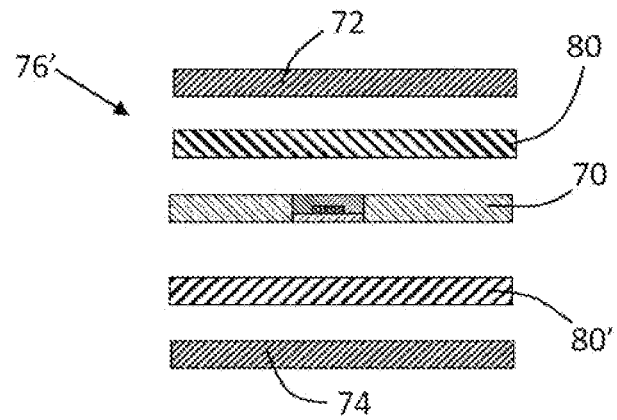

For clarity an exploded representation of the laminated glazing 76" is shown in FIG. 20b.

In FIG. 19, the ply of interlayer material 80 may be replaced by another ply 70 having been made according to an aspect of the present invention.

In FIG. 20, either or both of the plies of interlayer material 80, 80' may be replaced by an interlayer ply having been made according to an aspect of the present invention.

Additional plies of interlayer material (conventional or made in accordance with the present invention) may be used in the construction of a laminated glazing as required.

FIGS. 21-23 are used to illustrate how an additional flex circuit 90 may be provided to help make the electrical connection to an electrically operable component mounted on a substrate, for example as in an electrically operable device of the type shown in FIG. 1 and FIG. 2.

In FIG. 21 there is shown a schematic isometric representation of an electrically operable device 1 as shown in FIGS. 1 and 2 and described in the related description thereof. FIG. 22 is a schematic side elevation of FIG. 21 i.e. viewed in the direction of arrow 82.

With reference to FIGS. 21 and 22, located beneath the electrically operable device 1 is a sheet of EVA 22. The sheet of EVA 22 has an upper major surface 22' and an opposing lower major surface (not labelled). The electrically operable device 1 is to be positioned on the sheet of EVA 22 by moving the electrically operable device 1 in the direction of arrow 84 such that the electrically operable device 1 is in the position shown by dotted line 1' on the sheet of EVA 22. Reference is also made to FIG. 3b.

After the electrically operable device 1 has been positioned on the sheet of EVA 22, a flex circuit 90 is positioned on the electrically operable device 1 by moving the flex circuit 90 in direction of arrow 86.

The flex circuit 90 comprises a substrate 92 having a first major surface 92a and an opposing second major surface 92b. When positioning the flex circuit 90 on the electrically operable device 1, the second major surface 92b of the substrate 92 faces the first major surface 5 of the substrate 3.

At one end of the substrate 92 on the second major surface 92b thereof are first and second electrical connector regions 94, 96. At the opposite end of the substrate 92 on the second major surface 92b thereof are third and fourth electrical connector regions 98, 100.

The first electrical connector region 94 is in electrical communication with the third electrical connector region 98 via electrically conductive track 102 on the second major surface 92b of the substrate 92 of the flex circuit 90. The second electrical connector region 96 is in electrical communication with the third electrical connector region 100 via electrically conductive track 104 on the second major surface 92b of the substrate 92 of the flex circuit 90.

The electrically conductive tracks 102, 104 may be a screen printed electrically conductive ink. Any or all of the first, second, third and fourth electrical connector regions 94, 96, 98, 100 may be screen printed electrically conductive ink.

The substrate 92 of the flex circuit 90 is similar to the substrate 3 of the electrically operable device 1. However, it is preferred that the substrate 92 is more mechanically robust than the substrate 3. For example, if the same material is used for the substrate 3 and the substrate 92, the substrate 92 is typically thicker than the substrate 3.

Alternatively, or as well as, the substrate 3 and the substrate 92 may be made of different materials, for example different plastic materials. In some embodiments a useful property of the substrate 92 is the ability to bend without breaking the electrically conductive tracks 102, 104 on the second major surface 92b.

The flex circuit 90 is used as an integral electrical connector to help with the provision of electrical power to the electrically operable component 9 of the electrically operable device 1.

The first electrical connector region 94 on the substrate 92 of the flex circuit 90 is arranged to be aligned with the first electrical connector region 11 on the substrate 3 of the electrically operable device 1. The second electrical connector region 96 on the substrate 92 of the flex circuit 90 is arranged to be aligned with the second electrical connector region 13 on the substrate 3 of the electrically operable device 1 (indicated in FIG. 21 by dotted lines extending therebetween). When the flex circuit 90 is positioned on the electrically operable device 1 as before described, the provision of electrical power to the third and fourth electrical connector regions 98, 100 on the substrate 92 of the flex circuit 90 provides power to the electrically operable component 9 because the first and second electrical connector regions 94, 96 on the substrate 92 are in electrical communication and mechanical communication with the respective first and second electrical connector regions 11, 13 on the substrate 3.

The third and fourth electrical connector regions 98, 100 are spaced apart from the first and second electrical connector regions 94, 96. The third and fourth electrical connector regions 98, 100 are also spaced apart from the periphery of the substrate 92 such that it is possible to remove a portion of the substrate 92 by cutting along a line (shown as line M-M') between the end of the substrate 92 and the third and fourth electrical connector regions 98, 100. The third and fourth electrical connector regions 98, 100 are also positioned on the substrate 3 in a region where there are no electrically conductive regions or tracks on the first major surface of the substrate 3.

The connection between the first electrical connector region 94 on the substrate 3 of the flex circuit and the first electrical connector region 11 on the substrate 5 of the electrically operable device 1 may be reinforced with the use of known electrical jointing methods such as localised spots of electrically conducting adhesive, localised application of anisotropically conducting adhesives or anisotropically conducting adhesive film, such as CP923CM-25AC manufactured by Dexerials Corp. (http://www.dexerials.jp/en/products/).

A schematic side view of the flex circuit 90 on the electrically operable device 1, the electrically operable device 1 being on the sheet of EVA 22 is shown in FIG. 23. In this figure there is shown a space 105 between the flex circuit 90 and the electrically operable device 1. With reference to the above, the space 105 is between the second major surface 92b of the substrate 92 of the flex circuit 90 and the first major surface 5 of the substrate 3 of the electrically operable device 1. In an alternative embodiment, the second major surface 92b of the substrate 92 of the flex circuit 90 or the first major surface 5 of the substrate 3 of the electrically operable device 1 may have a restickable adhesive thereon such that the substrate 92 is removably adhered to the substrate 3. In another alternative embodiment, there may be no space between the second major surface 92b of the substrate 92 of the flex circuit 90 and the first major surface 5 of the substrate 3 of the electrically operable device 1.

Although in FIG. 23 the flex circuit 90 is aligned at one end with the periphery of the substrate 3, the flex circuit may extend beyond the periphery of the substrate 3 of the electrically operable device 1.

FIG. 24 is used to illustrate how an electrical device according to an aspect of the present invention is produced. FIG. 24 is similar to FIG. 12 previously described.

A plastic barrier 106 is positioned on the sheet of EVA 22. A hermetic seal is made between the base of the barrier 106 and the first major surface 22' of the sheet of EVA 22. In a similar way as shown in FIG. 10, when viewed in plan view, the barrier 106 completely surrounds the electrically operable device 1 with the flex circuit 90 thereon.

A suitable liquid plastic is poured into the region bounded by the barrier 106 to fully cover electrically operable device 1 with the flex circuit 90 thereon. The layer of liquid plastic 108 is levelled to the height of the barrier 106, either by a levelling step or by allowing the liquid to settle.

The layer of liquid plastic 108 is suitably cured to form a solid layer of plastic 108 that encapsulates the electrically operable device 1 with the flex circuit 90 thereon i.e. the electrically operable device 1 with the flex circuit 90 thereon is encapsulated between the solid layer of plastic 108 and the sheet of EVA 22. The solid layer of plastic 108 is also bonded to the first major surface 22' of the sheet of EVA 22. As is readily apparent, the liquid plastic is an adhesive.

As discussed above, in FIGS. 23 and 24 there is shown a slight gap 105 between the second major surface 92b of the substrate 92 and the first major surface 5 of the sheet of substrate 3 when the flex circuit 90 is on the electrically operable device 1. The thickness of said gap 105 may be sufficiently small such that when the liquid plastic is poured into the region bounded by the barrier 106, the liquid plastic is not able to flow into the gap because of the viscosity of the liquid plastic. Alternatively, the flex circuit 90 may be configured such that there is no gap between the second major surface 92b of the substrate 92 and the first major surface 5 of the substrate 3 when the flexible circuit board 90 is on the electrically operable device 1. Alternatively, or in addition to, one or more regions of the second major surface 92b may be provided with a suitable restickable adhesive such that when the flex circuit 90 is on the electrically operable device 1, the substrate 92 is removably attached to the substrate 3 and/or the sheet of EVA 22. The suitable restickable adhesive helps form a seal when the liquid plastic is poured onto the electrically operable device 1.

The encapsulated electrically operable device 1 with the flex circuit 90 thereon is used as a parent electrical device for the production of a child electrical device. The electrically operable device 1 is fixed on the sheet of EVA 22 by the solid layer plastic 108 and is removed therefrom by cutting along a line inboard of the barrier 106 i.e. along the lines F-F' and G-G' shown in FIG. 24. The electrical device 110 so produced is shown in FIG. 25a, where it can be seen that essentially the electrically operable device 1 is encapsulated between a portion 108' of the solidified plastic layer 108 and a portion 22" of the sheet of EVA 22. If the child electrical device is produced by cutting along the line H-H' instead of cutting along the line F-F' then a subsequent cutting step will be required to gain access to the flex circuit 90 i.e. essentially by cutting along a portion of the line F-F'.

In this example the thickness 107 of the electrical device 110 is about 0.76 mm. A schematic isometric representation of the electrical device 110 is shown in FIG. 25b.

In accordance with an aspect of the present invention, the electrical device 110 may be incorporated into a large sheet of suitable interlayer material 112 having a thickness of about 0.76 mm, in a similar manner to that described in relation to FIGS. 14-17. A schematic cross-sectional elevation of the interlayer ply 114 so produced is illustrated in FIG. 26a and a schematic isometric representation of the interlayer ply 114 is illustrated in FIG. 26b. In FIG. 26b, for clarity the electrical device 110 is shown removed from the aperture 116 in the large sheet of suitable interlayer material 112.

The electrical device 110 may be bonded in the aperture by using suitable adhesive means as previously described, for example using spots or strips of adhesive.

Although in FIGS. 26a and 26b only one electrical device 110 is shown incorporated in the sheet of suitable interlayer material 112, there may be two or more such electrical devices incorporated in the sheet of suitable interlayer material 112.

The interlayer 114 may be used in the construction of a laminated glazing of the type shown in FIGS. 18-20. A particular example is shown in FIG. 27 which helps illustrate the benefit of the additional flex circuit 90.

As is evident from FIGS. 26a and 26b, when the electrical device 110 is incorporated into a sheet of suitable interlayer material 112, the electrical device 110 may be produced by cutting along the line H-H' instead of the line F-F' shown in FIG. 24 because the electrical device so produced is fully surrounded by interlayer material 112 when in the aperture 116.

FIG. 27 shows a schematic cross-sectional representation of a laminated glazing 120. The laminated glazing comprises a first sheet of soda-lime-silica glass 122 having a thickness of 2.1 mm and a second sheet of soda-lime-silica glass 124 also having a thickness of 2.1 mm. The first sheet of soda-lime-silica glass 122 is joined to the second sheet of soda-lime silica glass by means of the interlayer ply 114, said interlayer ply including the electrical device 110 fixed in an aperture 116 in the sheet of suitable interlayer material 112.

An expanded view of one end of the laminated glazing 120 is shown in FIG. 28. A portion 114' of the interlayer ply 114 extends beyond the periphery of the first and second sheets of soda-lime-silica glass 122, 124. The portion 114' includes the end of the substrate 92 of the flex circuit 90 that has the third and fourth electrical connector regions 98, 100 thereon such that the third and fourth electrical connector regions 98, 100 are not between the first and second sheets of soda-lime-silica glass 122, 124. The first and second electrical connector regions 94, 96 are between the first and second sheets of soda-lime-silica glass 122, 124, as is the electrically operable component 9. A part of the portion 114' is removed by cutting along the line J-J' thereby providing access to the flex circuit 90.

Due to the weak bonding between the substrate 3 and the substrate 92, for example due to the provision of a restickable adhesive on the second major surface 92b of the substrate 92 and/or the first major surface 5 of the substrate 3 during the production of the electrically operable device as previously described (or there may be no bonding therebetween), an end portion of the lower portion of the electrical device may be folded downwards (i.e. in the direction of arrow 117) thereby allowing access to the third and fourth electrical connector regions 98, 100 on the portion 92' of the substrate 92 of the flex circuit 90.

As the substrate 92 is more mechanically rigid and/or more mechanically strong and/or mechanically/chemically robust than the substrate 3, the additional of the flex circuit 90 may allow more reliable electrical connections to be made to power the electrically operable component 9. For example, if no additional flex circuit is used, and instead the first and/or second electrical connector regions 11, 13 extend beyond the periphery of the first and second sheets of soda-lime-silica glass 122, 124, it is possible the first and/or second electrically conductive tracks 15, 17 on the substrate 3 may be damaged unless said tracks are suitably mechanically robust. Furthermore, without the provision of an additional flex circuit 90, a portion of the substrate 3 may be exposed such that damage thereto may occur with the risk of breaking any electrically conductive tracks thereon. The provision of the flex circuit 90 may reduce the occurrence of such damage because the substrate 92 of the flex circuit 90 is more mechanically rigid and/or more mechanically strong and/or mechanically/chemically robust than the substrate 3.

The present invention provides an electrical device and a method for making the electrical device. The electrical device may be incorporated into a sheet of interlayer material and the interlayer ply thus produced may be used in the manufacture of a laminated glazing. Such laminated glazings may be flat or curved and find particular application as windows for vehicles and/or buildings.

The invention claimed is:

1. A method of making an electrical device comprising:
   (i) providing a layer of interlayer material having a first major surface and a second opposing major surface;
   (ii) positioning at least a first electrically operable component on the first major surface of the first layer of interlayer material, the first electrically operable component being mounted on a first circuit board; and
   (iii) providing a layer of adhesive material to cover at least a portion of the first major surface of the layer of interlayer material and at least a portion of the first electrically operable component and/or at least a portion of the first circuit board
   such that following (iii) the first electrically operable component is fixed on the layer of interlayer material by at least a portion of the layer of adhesive material,
   wherein following (ii) at least a second electrically operable component is positioned on the layer of interlayer material, the second electrically operable component being mounted on a second circuit board, further wherein the second electrically operable component is spaced apart from the first electrically operable device and/or the first circuit board is spaced apart from the second circuit board.

2. A method according to claim 1, wherein in (ii) the first circuit board is positioned on the first major surface of the layer of interlayer material such that the first circuit board is between the layer of interlayer material and the first electrically operable component; and/or wherein after (i) a first barrier is provided on the first major surface of the layer of interlayer material or around the periphery of the layer of interlayer material, and following (ii) at least a portion of the first circuit board is inboard of the first barrier; and/or wherein following (iii) at least a portion of the first circuit board having the first electrically operable component mounted thereon is removed from the layer of interlayer material to produce an electrical device being a child electrical device.

3. A method according to claim 1, wherein in (iii) the adhesive material is provided as a liquid to provide the layer of adhesive material and/or wherein in (i) the layer of interlayer material is provided as a sheet of interlayer material and/or wherein at least one of the interlayer material and the adhesive material comprises polyvinyl butyral (PVB), a copolymer of ethylene or polyurethane.

4. A method according to claim 1, wherein the layer of adhesive material has a thickness between 0.3 mm and 3.0 mm and/or wherein the layer of interlayer material has a thickness between 0.3 mm and 2.0 mm and/or wherein the layer of adhesive material covers the entire electrically operable component and/or the entire first circuit board.

5. A method according to claim 1, wherein during (iii), the layer of adhesive material also covers at least a portion of the second electrically operable component and/or at least a portion of the second circuit board, or wherein following (iii) a second layer of adhesive material is provided to cover at least a portion of the second electrically operable component and/or at least a portion of the second circuit board.

6. A method of making an electrical device comprising:
   (i) providing a layer of interlayer material having a first major surface and a second opposing major surface;
   (ii) positioning at least a first electrically operable component on the first major surface of the first layer of interlayer material, the first electrically operable component being mounted on a first circuit board; and
   (iii) providing a layer of adhesive material to cover at least a portion of the first major surface of the layer of interlayer material and at least a portion of the first electrically operable component and/or at least a portion of the first circuit board
   such that following (iii) the first electrically operable component is fixed on the layer of interlayer material by at least a portion of the layer of adhesive material,
   wherein before (iii) a flex circuit is positioned on the layer of interlayer material or the first circuit board, the flex circuit comprising a substrate having a first major surface and an opposing second major surface, the first or second major surface of the substrate of the flex circuit comprising a first electrical connector region thereon in electrical communication with a second electrical connector region on the first or second major surface of the substrate of the flex circuit by an electrically conductive track; wherein the flex circuit is positioned such that the second electrical connector region on the substrate of the flex circuit is in electrical communication with a first electrical connector region on the first circuit board.

7. A method according to claim 6, wherein the substrate of the flex circuit comprises on the first or second major surface thereof a third electrical connector region in electrical communication with a fourth electrical connector region on the first or second major surface of the substrate of the flex circuit by an electrically conductive track; wherein the flex circuit is positioned such that the fourth electrical connector region on the substrate of the flex circuit is in electrical communication with a second electrical connector region on the first circuit board.

8. A method according to claim 6, wherein in (ii) the first circuit board is positioned on the first major surface of the layer of interlayer material such that the first circuit board is between the layer of interlayer material and the first electrically operable component; and/or wherein after (i) a first barrier is provided on the first major surface of the layer of interlayer material or around the periphery of the layer of interlayer material, and following (ii) at least a portion of the first circuit board is inboard of the first barrier; and/or wherein following (iii) at least a portion of the first circuit board having the first electrically operable component mounted thereon is removed from the layer of interlayer material to produce an electrical device being a child electrical device.

9. A method according to claim 6, wherein in (iii) the adhesive material is provided as a liquid to provide the layer of adhesive material and/or wherein in (i) the layer of interlayer material is provided as a sheet of interlayer material and/or wherein at least one of the interlayer material and the adhesive material comprises polyvinyl butyral (PVB), a copolymer of ethylene or polyurethane.

10. A method according to claim 6, wherein the layer of adhesive material has a thickness between 0.3 mm and 3.0 mm and/or wherein the layer of interlayer material has a thickness between 0.3 mm and 2.0 mm and/or wherein the layer of adhesive material covers the entire electrically operable component and/or the entire first circuit board.

11. A method of making an electrical device comprising:
(i) providing a layer of interlayer material having a first major surface and a second opposing major surface;
(ii) positioning at least a first electrically operable component on the first major surface of the first layer of interlayer material, the first electrically operable component being mounted on a first circuit board; and
(iii) providing a layer of adhesive material to cover at least a portion of the first major surface of the layer of interlayer material and at least a portion of the first electrically operable component and/or at least a portion of the first circuit board
such that following (iii) the first electrically operable component is fixed on the layer of interlayer material by at least a portion of the layer of adhesive material,
wherein after (iii), the method includes incorporating the electrical device in an aperture in another sheet of interlayer material, wherein incorporating the electrical device in the aperture in the another sheet of interlayer material comprises providing a sheet of interlayer material having a first major surface and a second opposing major surface; removing at least a first portion of the sheet of interlayer material to make an aperture in the sheet of interlayer material, the aperture in the sheet of interlayer material having at least a first wall between the first and second major surfaces of the sheet of interlayer material; positioning at least a portion of the electrical device in the aperture; using bonding means to fix the electrical device to at least a portion of the first and/or second major surface of the sheet of interlayer material and/or at least a portion of the first wall of the aperture in the sheet of interlayer material.

12. A method according to claim 11, wherein in (ii) the first circuit board is positioned on the first major surface of the layer of interlayer material such that the first circuit board is between the layer of interlayer material and the first electrically operable component; and/or wherein after (i) a first barrier is provided on the first major surface of the layer of interlayer material or around the periphery of the layer of interlayer material, and following (ii) at least a portion of the first circuit board is inboard of the first barrier; and/or wherein following (iii) at least a portion of the first circuit board having the first electrically operable component mounted thereon is removed from the layer of interlayer material to produce an electrical device being a child electrical device.

13. A method according to claim 11, wherein in (iii) the adhesive material is provided as a liquid to provide the layer of adhesive material and/or wherein in (i) the layer of interlayer material is provided as a sheet of interlayer material and/or wherein at least one of the interlayer material and the adhesive material comprises polyvinyl butyral (PVB), a copolymer of ethylene or polyurethane.

14. A method according to claim 11, wherein the layer of adhesive material has a thickness between 0.3 mm and 3.0 mm and/or wherein the layer of interlayer material has a thickness between 0.3 mm and 2.0 mm and/or wherein the layer of adhesive material covers the entire electrically operable component and/or the entire first circuit board.

15. An electrical device comprising:
at least one electrically operable component mounted on a first circuit board, the first circuit board having a first major surface and a second opposing major surface;
at least one layer of interlayer material having an outer major surface; and
at least one layer of adhesive material having an outer major surface;
wherein the first circuit board with the at least one electrically operable component mounted thereon is between the outer major surface of the at least one layer of interlayer material and the outer major surface of the at least one layer of adhesive material;
further wherein the first circuit board is fixed to the layer of interlayer material by at least the layer of adhesive material;
the electrical device has a first outer surface and a second opposing outer surface, wherein
(a) the first outer surface of the electrical device comprises the outer major surface of the at least one layer of interlayer material and the second outer surface of the electrical device comprises the outer major surface of the at least one layer of adhesive material,
or
(b) the first outer surface of the electrical device comprises the outer major surface of the at least one layer of adhesive material and the second outer surface of the electrical device comprises the outer major surface of the at least one layer of interlayer material,
wherein the electrically operable component has first and second input terminals for providing electrical power thereto and wherein first circuit board comprises a first electrical connector region, the first electrical connector region of the first circuit board being in electrical communication with the first input terminal of the electrically operable device, further wherein the electrical device comprises a flex circuit, the flex circuit comprising a substrate having a first major surface and an opposing second major surface, the first or second major surface of the substrate of the flex circuit comprising a first electrical connector region thereon in electrical communication with a second electrical connector region on the first or second major surface of the substrate of the flex circuit by an electrically conductive track, the first electrical connector region on the substrate of the flex circuit being in electrical and mechanical communication with the first electrical connector region on the first circuit board such that upon bringing the second input terminal of the at least one electrically operable component into electrical communication with a first output terminal of a suitable power supply and bringing the second electrical connector region of the flex circuit into electrical communication with a second output terminal of the suitable power supply, electrical power is provided to the at least one electrically operable component.

16. An electrical device according to claim 15, wherein the substrate of the flex circuit comprise a third electrical connector region on the first or second major surface of the substrate of the flex circuit in electrical communication with a fourth electrical connector region on the first or second major surface of the substrate of the flex circuit by an electrically conductive track, the third electrical connector region on the substrate of the flex circuit being in electrical and mechanical communication with a second electrical connector region on the first circuit board, the second electrical connector region on the first circuit board being in electrical communication with the second input terminal of the at least one electrically operable component, wherein upon bringing the fourth electrical connector region of the flex circuit into electrical communication with a first output terminal of a suitable power supply and bringing the second electrical connector region of the flex circuit into electrical communication with a second output terminal of the suitable power supply, electrical power is provided to the at least one electrically operable component.

17. An electrical device according to claim 15, wherein the second major surface of the substrate of the flex circuit faces the first major surface of the first circuit board, and/or wherein a temporary adhesive means is between at least a portion of the first major surface of the first circuit board and the second major surface of the substrate of the flex circuit.

18. A laminated glazing comprising at least one sheet of glazing material and an electrical device according to claim 15, wherein the electrical device is joined to the at least one sheet of glazing material by the at least one layer of interlayer material or the at least one layer of adhesive material.

19. An electrical device comprising:
- at least one electrically operable component mounted on a first circuit board, the first circuit board having a first major surface and a second opposing major surface;
- at least one layer of interlayer material having an outer major surface; and
- at least one layer of adhesive material having an outer major surface;
- wherein the first circuit board with the at least one electrically operable component mounted thereon is between the outer major surface of the at least one layer of interlayer material and the outer major surface of the at least one layer of adhesive material;
- further wherein the first circuit board is fixed to the layer of interlayer material by at least the layer of adhesive material;
- the electrical device has a first outer surface and a second opposing outer surface, wherein
- (a) the first outer surface of the electrical device comprises the outer major surface of the at least one layer of interlayer material and the second outer surface of the electrical device comprises the outer major surface of the at least one layer of adhesive material, or (b) the first outer surface of the electrical device comprises the outer major surface of the at least one layer of adhesive material and the second outer surface of the electrical device comprises the outer major surface of the at least one layer of interlayer material, wherein the electrical device is part of an interlayer ply, the interlayer ply being suitable for joining two sheets of glass together, wherein the interlayer ply comprises a sheet of interlayer material having a first major surface and a second opposing major surface, there being an aperture in the sheet of interlayer material, the aperture having a wall extending between the first and second major surfaces of the sheet of interlayer material, the electrical device being positioned in the aperture in the sheet of interlayer material and bonded to at least a portion of the wall of the aperture and/or at least a portion of the first and/or second major surface of the sheet of interlayer material; and/or wherein at least one of the at least one layer of interlayer material and the at least one layer of adhesive material comprises polyvinyl butyral (PVB), a copolymer of ethylene or polyurethane.

20. A laminated glazing comprising at least one sheet of glazing material and an electrical device according to claim 19, wherein the electrical device is joined to the at least one sheet of glazing material by the at least one layer of interlayer material or the at least one layer of adhesive material.

* * * * *